(12) United States Patent
Kim et al.

(10) Patent No.: US 12,161,027 B2
(45) Date of Patent: Dec. 3, 2024

(54) DISPLAY DEVICE WITH ELECTRODE PATTERN SEPARATED FROM ELECTRODE AND OVERLAPPING VOLTAGE LINE

(71) Applicant: Samsung Display Co., Ltd., Yongin-si (KR)

(72) Inventors: Ki Bum Kim, Hwaseong-si (KR); Kyung Tae Chae, Hwaseong-si (KR); Ki Nyeng Kang, Sejong-si (KR); Jin Taek Kim, Yongin-si (KR); Hyun Wook Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 698 days.

(21) Appl. No.: 17/236,995

(22) Filed: Apr. 21, 2021

(65) Prior Publication Data

US 2021/0367024 A1 Nov. 25, 2021

(30) Foreign Application Priority Data

May 20, 2020 (KR) .................. 10-2020-0060274

(51) Int. Cl.
*H10K 59/131* (2023.01)
*H10K 59/123* (2023.01)

(52) U.S. Cl.
CPC ......... *H10K 59/131* (2023.02); *H10K 59/123* (2023.02)

(58) Field of Classification Search
CPC .................. H10K 59/131; H10K 59/123
See application file for complete search history.

(56) References Cited

U.S. PATENT DOCUMENTS

| 10,367,123 | B2 * | 7/2019 | Im | H01L 33/52 |
| 10,991,865 | B2 * | 4/2021 | Kim | H01L 33/62 |
| 2019/0019930 | A1 * | 1/2019 | Do | H01L 24/95 |
| 2021/0134768 | A1 * | 5/2021 | Lee | H01L 33/38 |
| 2021/0242380 | A1 * | 8/2021 | Kim | H01L 33/38 |
| 2021/0288033 | A1 * | 9/2021 | Lim | H01L 33/08 |

FOREIGN PATENT DOCUMENTS

| KR | 10-2020-0006208 A | 1/2020 | |
| KR | 10-2020-0028065 A | 3/2020 | |
| KR | 10-2021-0053391 | 5/2021 | |
| WO | WO-2020013386 A1 * | 1/2020 | ......... H01L 25/0753 |

* cited by examiner

*Primary Examiner* — Lex H Malsawma

(74) *Attorney, Agent, or Firm* — Lewis Roca Rothgerber Christie LLP

(57) ABSTRACT

A display device including: a substrate; a conductive layer on the substrate and including a first voltage line and a second voltage line extending in a first direction; a first electrode and a second electrode on the conductive layer, extending in the first direction, and spaced apart from each other; a plurality of light-emitting elements on the first electrode and the second electrode; and an electrode pattern on the conductive layer and separated from the first electrode. The electrode pattern overlaps the first voltage line in a thickness direction and directly contacts the first voltage line.

20 Claims, 18 Drawing Sheets

DISPLAY DEVICE WITH ELECTRODE PATTERN SEPARATED FROM ELECTRODE AND OVERLAPPING VOLTAGE LINE

CROSS-REFERENCE TO RELATED APPLICATION

This application claims priority to and the benefit of Korean Patent Application No. 10-2020-0060274, filed on May 20, 2020, in the Korean Intellectual Property Office, the entire contents of which are herein incorporated by reference.

BACKGROUND

1. Field

Aspects of embodiment of the present disclosure relate to a display device.

2. Description of the Related Art

Display devices become more and more important as multimedia technology evolves. Accordingly, a variety of display devices, such as organic light-emitting diode (OLED) display devices and liquid crystal display (LCD) devices, are currently used.

Display devices display images and generally include a display panel, such as an organic light-emitting diode display panel or a liquid crystal display panel. These display panels may be light-emitting display panels including light-emitting elements, for example, light-emitting diodes (LEDs). Light-emitting diodes may include an organic light-emitting diode (OLED) using an organic material as a fluorescent material and an inorganic light-emitting diode using an inorganic material as a fluorescent material.

SUMMARY

Aspects of the present disclosure provide an inorganic light-emitting diode display device (e.g., an inorganic light-emitting diode display device including a novel electrode structure).

Aspects of the present disclosure also provide a display device that can be made by a more efficient fabrication process.

It should be noted that the present disclosure is not limited to the above-mentioned aspects and features, and other aspects and features of the present disclosure will be apparent to those skilled in the art from the following descriptions.

According to embodiments of the present disclosure, electrodes may be separately disposed in each sub-pixel in a display device, and an alignment signal may be applied thereto by using a conductive layer under the electrodes during a process of aligning light-emitting elements. Because the resistance of the electrical lines to which the alignment signal is applied is lower than that of the electrodes, it is possible to avoid or mitigate voltage drop of the alignment signal. In addition, because an electric field due to the alignment signal is not generated at the borders of the sub-pixels, the number of light-emitting elements which may be disposed (or aligned) at undesired locations and lost can be reduced.

It should be noted that aspects and features of the present disclosure are not limited to those described above and other aspects and features of the present disclosure will be apparent to those skilled in the art from the following descriptions.

According to an embodiment of the present disclosure, a display device includes: a substrate; a conductive layer on the substrate and comprising a first voltage line and a second voltage line extending in a first direction; a first electrode and a second electrode on the conductive layer, extending in the first direction, and spaced apart from each other; a plurality of light-emitting elements on the first electrode and the second electrode; and an electrode pattern on the conductive layer and separated from the first electrode. The electrode pattern overlaps the first voltage line in a thickness direction and directly contacts the first voltage line.

The electrode pattern may be spaced apart from the first electrode in the first direction.

The display device may further include an interlayer dielectric layer on the conductive layer, and the electrode pattern may contact the first voltage line through a contact opening penetrating through the interlayer dielectric layer.

The display device may further include a plurality of first banks between the interlayer dielectric layer and the first electrode and between the interlayer dielectric layer and the second electrode. The electrode pattern may not overlap the first banks and is directly on the interlayer dielectric layer.

The display device may further include a second bank on the interlayer dielectric layer and extending around a periphery of an emission area at where the light-emitting elements are arranged and a cut area at one side of the emission area in the first direction. The electrode pattern may overlap the second bank in the thickness direction.

The first electrode and the electrode pattern may be spaced apart from each other with the cut area therebetween, and the second electrode may extend across the cut area from the emission area.

The conductive layer may further include a first conductive pattern electrically connected to the first voltage line through a first transistor between the substrate and the conductive layer, the first electrode may directly contact the first conductive pattern through a first contact opening penetrating through the interlayer dielectric layer, and the second electrode may directly contact the second voltage line through a second contact opening penetrating through the interlayer dielectric layer.

The first electrode may contact the first conductive pattern at a first electrode contact portion arranged at one side of the emission area in the first direction, and the second electrode may contact the second voltage line at a second electrode contact portion at an opposite side of the cut area in a second direction.

The display device may further include a first insulating layer partially covering the first electrode and the second electrode, and the light-emitting elements may be directly on the first insulating layer.

The display device may further include: a first contact electrode on the first insulating layer and contacting the first electrode and the light-emitting elements, and a second contact electrode on the first insulating layer and contacting the second electrode and the light-emitting elements.

The display device may further include a second insulating layer on the light-emitting elements.

According to another embodiment of the present disclosure, a display device includes: a substrate having an emission area and a cut area at one side of the emission area; a first electrode and a second electrode on the substrate, extending in a first direction, and spaced apart from each other in a second direction; a third electrode between the first electrode and the second electrode; a fourth electrode spaced apart from the third electrode in the second direction with the second electrode therebetween; a plurality of light-emitting elements on at least two of the first to fourth electrodes that are spaced apart from one another in the second direction; an electrode pattern separated from the first electrode and outside the emission area; a first contact electrode on the first electrode and contacting the light-emitting elements, and a second contact electrode on the second electrode and contacting the light-emitting elements; and a third contact electrode on the third electrode and the fourth electrode and contacting the light-emitting elements.

The display device may further include a conductive layer on the substrate and including a first voltage line and a second voltage line extending in the first direction. The electrode pattern may be directly connected to the first voltage line.

The electrode pattern and the first electrode may be partially in the cut area and spaced apart from each other.

The electrode pattern may be at one side of the cut area in the second direction and may overlap the first voltage line in a thickness direction.

The display device may further include a first transistor between the substrate and the conductive layer and electrically connected to the first voltage line. The first electrode may be electrically connected to the first transistor, and the second electrode may be directly connected to the second voltage line.

The display device may further include: a plurality of first banks between the substrate and the first to fourth electrodes, respectively; and a second bank extending around a periphery of the emission area and the cut area. Each of the first electrode and the second electrode may include an electrode contact portion overlapping the second bank.

The light-emitting elements may include a first light-emitting element having a first end on the first electrode and a second end on the third electrode, and a second light-emitting element having a first end on the fourth electrode and a second end on the second electrode.

The first contact electrode may contact the first end of the first light-emitting element and the first electrode, and the second contact electrode may contact the second end of the second light-emitting element and the second electrode.

The third contact electrode may extend around a periphery of the second contact electrode and may contact the third electrode, the fourth electrode, the second end of the first light-emitting element, and the first end of the second light-emitting element.

BRIEF DESCRIPTION OF THE DRAWINGS

The above and other aspects and features of the present disclosure will become more apparent by describing, in detail, embodiments thereof with reference to the attached drawings, in which.

DETAILED DESCRIPTION

Figure 1:
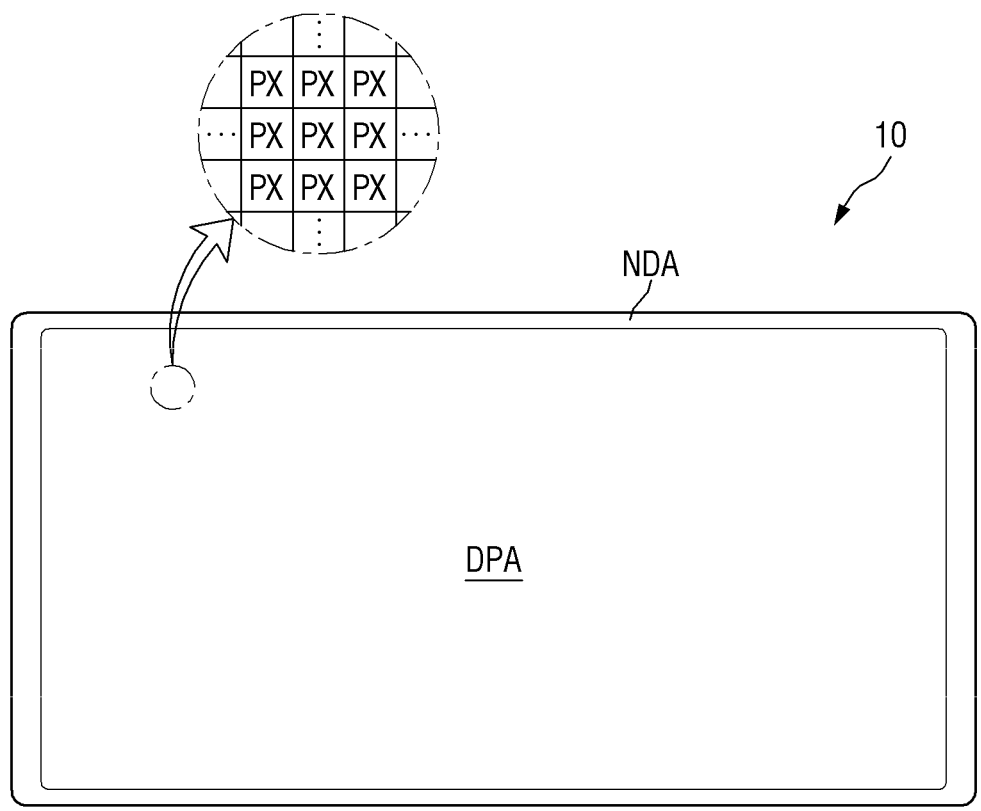
FIG. 1 is a plan view of a display device according to an embodiment of the present disclosure.

The present disclosure will now be described more fully hereinafter with reference to the accompanying drawings, in which embodiments of the disclosure are shown. The present disclosure may, however, be embodied in different forms and should not be construed as limited to the embodiments set forth herein. Rather, these embodiments are provided so that this disclosure will be thorough and complete and will fully convey the scope of the disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numbers indicate the same components throughout the specification and drawings. As used herein, the term "and/or" includes any and all combinations of one or more of the associated listed items. Further, the use of "may" when describing embodiments of the present invention relates to "one or more embodiments of the present invention."

Expressions, such as "at least one of," when preceding a list of elements, modify the entire list of elements and do not modify the individual elements of the list. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing particular example embodiments of the present invention and is not intended to be limiting of the described example embodiments of the present invention. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could be termed the first element.

Hereinafter, embodiments of the present disclosure will be described with reference to the accompanying drawings.

FIG. 1 is a plan view of a display device according to an embodiment of the present disclosure.

Referring to FIG. 1, a display device 10 displays (is configured to display) a moving image or a still image. The display device 10 may refer to any electronic device that includes a display screen. For example, the display device 10 may include a television set, a laptop computer, a monitor, an electronic billboard, an Internet of Things (IoT) devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console, a digital camera, a camcorder, etc.

The display device 10 includes a display panel providing (or including) a display screen. Examples of the display panel may include an inorganic light-emitting diode display panel, an organic light-emitting diode display panel, a quantum-dot light-emitting display panel, a plasma display panel, a field emission display panel, etc. In the following description, the display panel is described as an inorganic light-emitting diode display panel, but the present disclosure is not limited thereto. Any other display panel may be employed as long as the technical idea of the present disclosure can be equally applied.

The shape of the display device 10 may be modified in a variety of ways (e.g., the display device 10 may be variously shaped). For example, the display device 10 may have a rectangular shape with longer lateral sides, a rectangular shape with longer vertical sides, a square shape, a quadrangular shape with rounded corners (vertices), other polygonal shapes, a circular shape, etc. The shape of a display area DPA of the display device 10 may be similar to the overall shape of the display device 10. FIG. 1 shows the display device 10 having a rectangular shape with longer horizontal sides and the display area DPA (e.g., the display area DPA having a similar rectangular shape).

The display device 10 may include the display area DPA and a non-display area NDA. In some embodiments, a plurality of separate non-display areas NDA may be provided. Images can be displayed in the display area DPA, and images are not displayed in the non-display area NDA. The display area DPA may be referred to as an active area, while the non-display area NDA may be referred to as an inactive area. The display area DPA may generally occupy the center of the display device 10.

The display area DPA may include a plurality of pixels PX. The plurality of pixels PX may be arranged in a matrix. The shape of each pixel PX may be, but is not limited to, a rectangle or a square when viewed from the top. In some embodiments, each pixel may have a diamond shape having inclined sides with respect to a direction. The stripe pixels PX and PenTile® pixels (e.g., diamond shape pixels) may be arranged alternately. PenTile® is a trademark owned by Samsung Display Co., Ltd. of the Republic of Korea. Each of the pixels PX may include at least one light-emitting element ED configured to emit light of a particular wavelength band to represent a corresponding color.

The non-display area NDA may be disposed around the display area DPA. The non-display area NDA may partially or entirely surround the display area DPA. The display area DPA may have a rectangular shape, and the non-display area NDA may be disposed to be adjacent to the four sides of the rectangular display area DPA. The non-display area NDA may form the bezel of the display device 10. Lines or circuit drivers included in the display device 10 may be disposed in the non-display area NDA (e.g., in the non-display area NDA at each side of the display area DPA), or external devices may be mounted to the display device 10.

Figure 2:
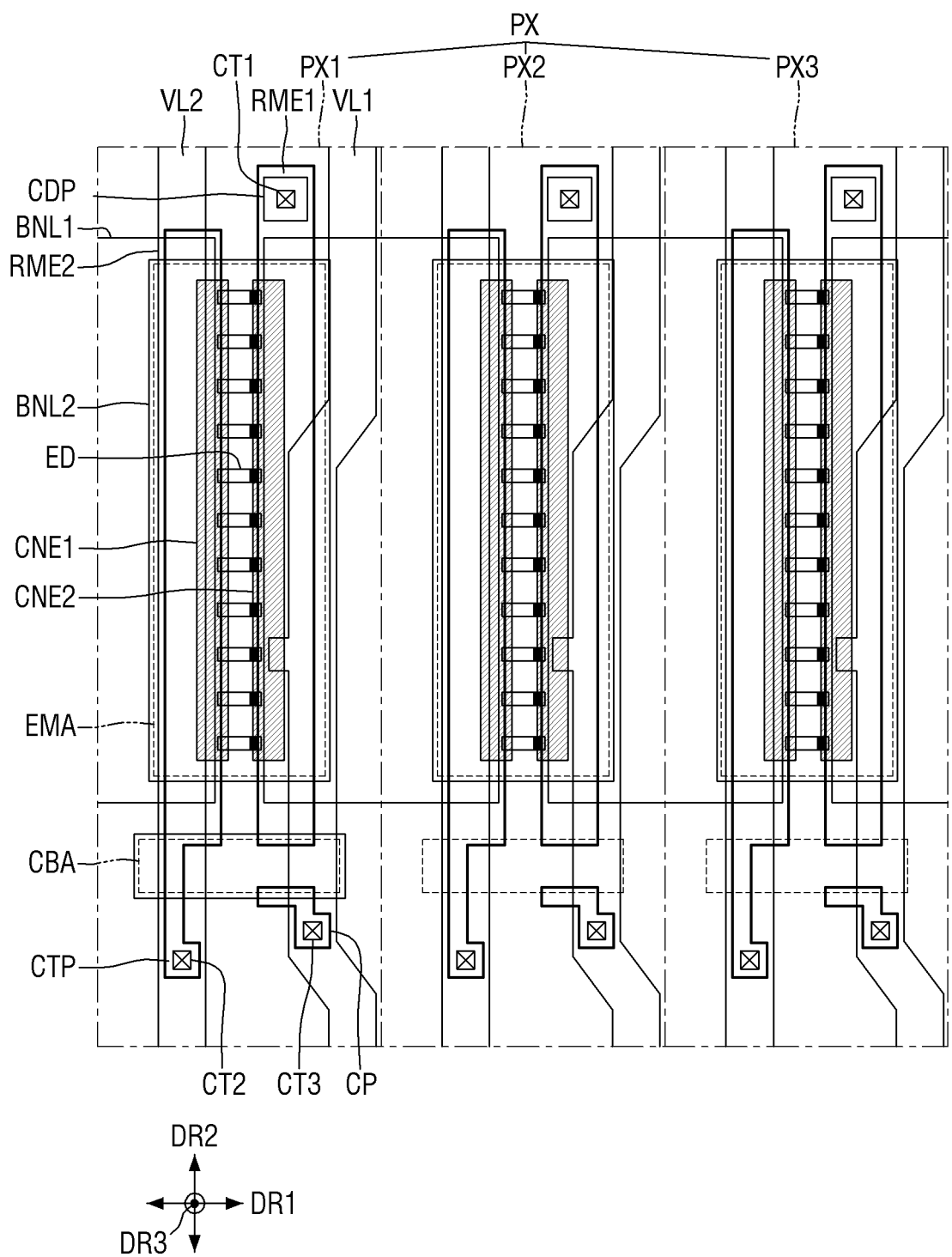
FIG. 2 is a plan view showing a pixel of a display device according to an embodiment of the present disclosure.

FIG. 2 is a plan view showing a pixel of a display device according to an embodiment of the present disclosure. FIG. 2 shows voltage lines VL1 and VL2, as well as electrodes RME1 and RME2, banks BNL1 and BNL2, light-emitting elements ED, and contact electrodes CNE1 and CNE2 disposed thereon.

Referring to FIG. 2, each of the plurality of pixels PX may include a plurality of sub-pixels PXn, where n is an integer from one to three or more. For example, a pixel PX may include a first sub-pixel PX1, a second sub-pixel PX2, and a third sub-pixel PX3. The first sub-pixel PX1 may emit light of a first color, the second sub-pixel PX2 may emit light of a second color, and the third sub-pixel PX3 may emit light of a third color. For example, the first color may be blue, the second color may be green, and the third color may be red. It is, however, to be understood that the present disclosure is not limited thereto. All of the sub-pixels PXn may emit light of the same color. Although the pixel PX includes three sub-pixels PX1-PX3 in the example shown in FIG. 2, the present disclosure is not limited thereto. The pixel PX may include more than two sub-pixels PXn.

Each of the sub-pixels PXn of the display device 10 may include an emission area EMA and a non-emission area. The light-emitting elements ED may be disposed in the emission area EMA to emit light of a particular wavelength. No light-emitting elements ED are disposed in the non-emission area, and light emitted from the light-emitting elements ED does not reach the non-emission are such that no light exits (or is emitted) therefrom. The emission area EMA may include an area in which the light-emitting elements ED are disposed and may include an area adjacent to the light-emitting elements ED where light emitted from the light-emitting elements ED exits.

It is, however, to be understood that the present disclosure is not limited thereto. The emission area EMA may also include an area in which light emitted from the light-emitting elements ED is reflected or refracted by other elements to exit therefrom. The plurality of light-emitting elements ED may be disposed in each of the sub-pixels PXn, and the emission area EMA may include not only the area where the light-emitting elements ED are disposed but also an adjacent area.

Each of the sub-pixels PXn may further include a cut area CBA disposed in the non-emission area. The cut area CBA may be disposed on one side of the emission area EMA in the second direction DR2. The cut area CBA may be disposed between the emission areas EMA of neighboring sub-pixels PXn in the second direction DR2. For example, in the display area DPA of the display device 10, a plurality of emission areas EMA and cut areas CBA may be arranged (e.g., alternately arranged). For example, the plurality of emission areas EMA and the cut areas CBA may be arranged repeatedly in the first direction DR1 and may be arranged alternately in the second direction DR2.

A second bank BNL2 may be disposed between the cutout regions CBA and the emission areas EMA, and the distance between them may vary depending on the width (e.g., a width in the second direction DR2) of the second bank BNL2. The light-emitting elements ED are not disposed in the cut areas CBA and, thus, no light exits therefrom. Parts of the electrodes RME disposed in each of the sub-pixels PXn may be disposed in the cut area CBA. The electrodes RME disposed in some sub-pixels PXn may be disposed separately from one another (e.g., may be separated from each other) in the cut area CBA. It is, however, to be understood that the present disclosure is not limited thereto. The electrodes RME may not be disposed separately in the cut area CBA.

Figure 3:
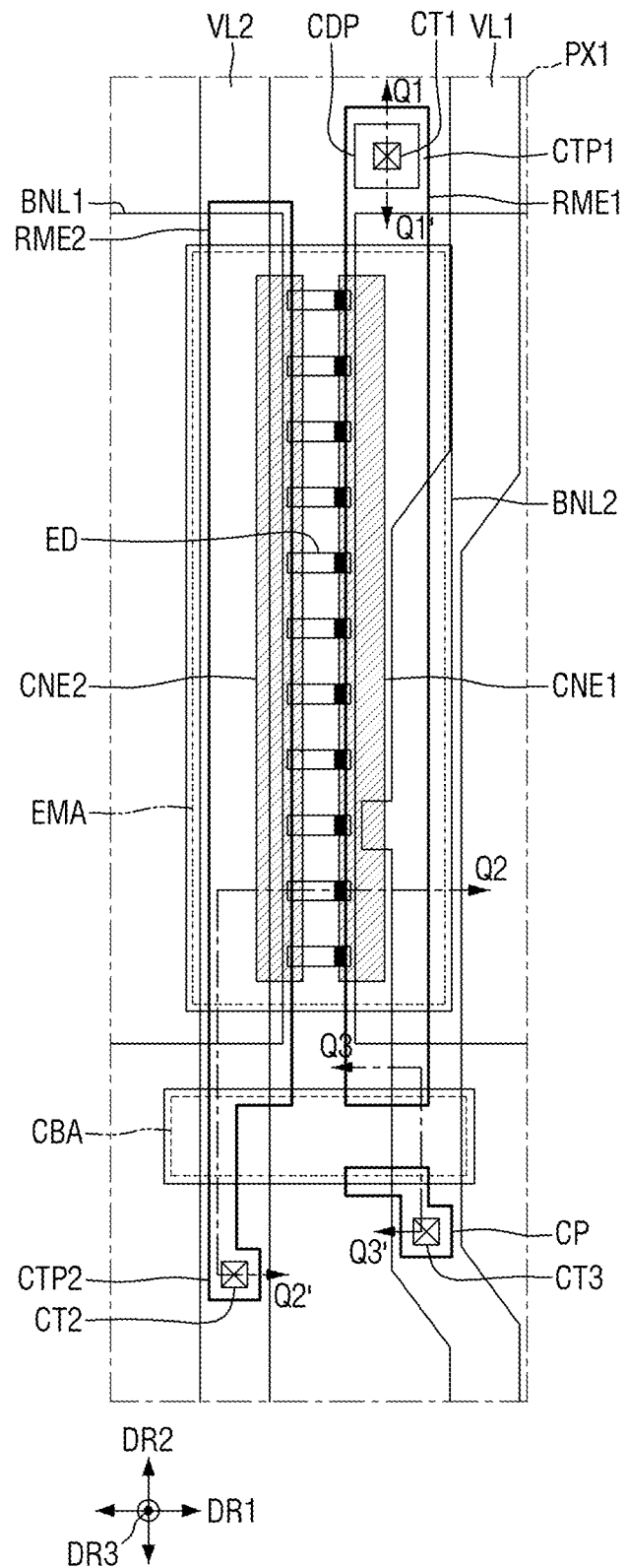
FIG. 3 is a plan view showing a first sub-pixel PX1 shown in FIG. 2.
Figure 4:
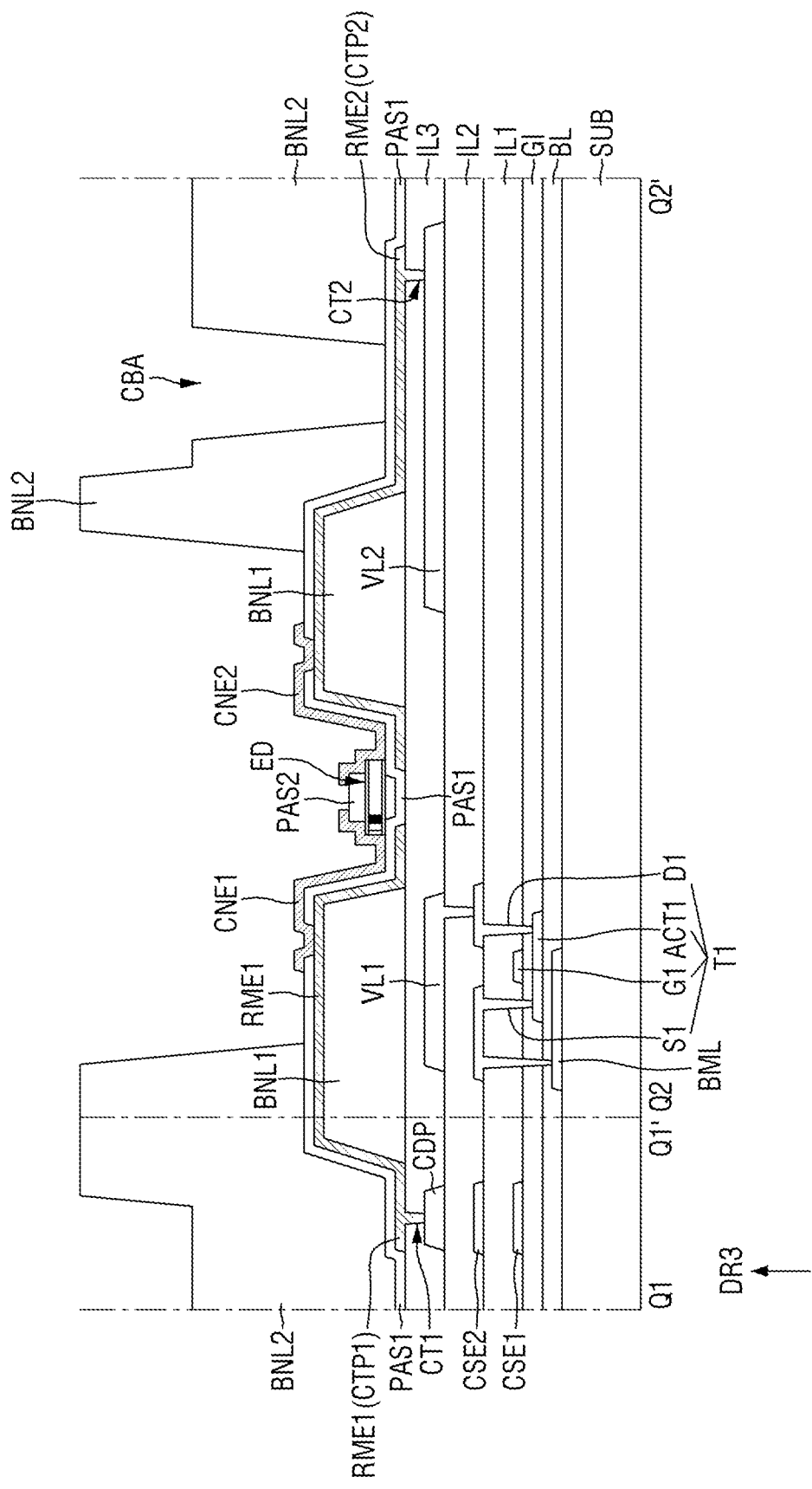
FIG. 4 is a cross-sectional view taken along the lines Q1-Q1' and Q2-Q2' in FIG. 3.

FIG. 3 is a plan view showing the first sub-pixel PX1 shown in FIG. 2. FIG. 4 is a cross-sectional view taken along the lines Q1-Q1' and Q2-Q2' in FIG. 3. FIG. 3 shows voltage lines VL1 and VL2 disposed in the first sub-pixel PX1, as well as electrodes RME1 and RME2, banks BNL1 and BNL2, light-emitting elements ED, and contact electrodes CNE1 and CNE2 disposed thereon. FIG. 4 shows a cross section from one end to the other end of the light-emitting element 30 disposed in one sub-pixel.

The display device 10 will be described in detail with reference to FIGS. 3 and 4 in conjunction with FIG. 2. The display device 10 may include a first substrate SUB and a semiconductor layer, a plurality of conductive layers, and a plurality of insulating layers disposed on the first substrate SUB. The semiconductor layer, the conductive layer, and the insulating layers may form a circuit layer and an emission material layer of the display device 10.

The first substrate SUB may be an insulating substrate. The first substrate SUB may include (or may be made of) an insulating material, such as glass, quartz, and a polymer resin. The first substrate SUB may be either a rigid substrate or a flexible substrate that can be bent, folded, or rolled.

The light-blocking layer BML may be disposed on the first substrate SUB. The light-blocking layer BML may overlap an active layer ACT1 of a first transistor T1. The light-blocking layer BML may include a material that blocks light and, thus, prevents or substantially prevents light from entering the active layer ACT1 of the first transistor T1. For example, the light-blocking layer BML may be formed of an opaque metal material that blocks light transmission. It is, however, to be understood that the present disclosure is not limited thereto. In some implementations, the light-blocking layer BML may be omitted (or eliminated).

A buffer layer BL may be disposed entirely on (e.g., on an entire surface of) the first substrate SUB, including on the light-blocking layer BML. The buffer layer BL may be formed on the first substrate SUB to protect the first thin-film transistors T1 of the pixels PX from moisture permeating through the first substrate SUB, which may be susceptible to moisture permeation, and may also provide a flat surface.

The semiconductor layer is disposed on the buffer layer BL. The semiconductor layer may include the active layer ACT1 of the first transistor T1. These may be disposed to partially overlap a gate electrode G1 of a first conductive layer, etc., which will be described in more detail below.

Although only the first transistor T1 from among the transistors included in the sub-pixels PXn of the display device 10 is depicted in the drawing, the present disclosure is not limited thereto. The display device 10 may include a greater number of transistors. For example, the display device 10 may include more than one transistor in addition to the first transistor T1 (e.g., two or three or more transistors in each of the sub-pixels PXn).

The semiconductor layer may include polycrystalline silicon, monocrystalline silicon, an oxide semiconductor, etc. When the semiconductor layer includes an oxide semiconductor, each active layer ACT1 may include a plurality of conductive regions and a channel region therebetween. The oxide semiconductor may be an oxide semiconductor including (or containing) indium (In). For example, the oxide semiconductor may be indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc.

In other embodiments, the semiconductor layer may include polycrystalline silicon. The polycrystalline silicon may be formed by crystallizing amorphous silicon, and in such an embodiment, the conductive regions of the active layer ACT1 may be doped regions doped with impurities.

A first gate insulating layer GI is disposed on the semiconductor layer and the buffer layer BL. The first gate insulating layer GI may be disposed on the buffer layer BL, including the semiconductor layer. The first gate insulating layer GI may act as a gate insulator for each of the thin-film transistors.

The first conductive layer is disposed on the first gate insulating layer GI. The first conductive layer may include the gate electrode G1 of the first transistor T1 and a first capacitor electrode CSE1 of a storage capacitor. The gate electrode G1 may be disposed so that it overlaps the channel region of the active layer ACT1 in the thickness direction. The first capacitor electrode CSE1 may be disposed so that it overlaps a second capacitor electrode CSE2, described in more detail below, in the thickness direction. According to an embodiment of the present disclosure, the first capacitor electrode CSE1 may be integrated with the gate electrode G1. The first capacitor electrode CSE1 may be disposed so that it overlaps the second capacitor electrode CSE2 in the thickness direction, and the storage capacitor may be formed between them.

A first interlayer dielectric layer IL1 is disposed on the first conductive layer. The first interlayer dielectric layer IL1 may act as an insulating layer between the first conductive layer and other layers disposed thereon. In addition, the first interlayer dielectric layer IL1 may be disposed so that it covers the first conductive layer to protect it.

The second conductive layer is disposed on the first interlayer dielectric layer IL1. The second conductive layer may include a first source electrode S1 and a first drain electrode D1 of the first transistor T1 and the second capacitor electrode CSE2.

The first source electrode S1 and the first drain electrode D1 of the first transistor T1 may contact the doping regions of the active layer ACT1, respectively, through contact openings (e.g., contact holes) penetrating through the first interlayer dielectric layer IL1 and the first gate insulating layer GI. In addition, the first source electrode S1 of the first transistor T1 may contact the light-blocking layer BML through another contact opening (e.g., contact hole).

The second capacitor electrode CSE2 may be disposed to overlap the first capacitor electrode CSE1 in the thickness direction. According to an embodiment of the present disclosure, the second capacitor electrode CSE2 may be integrally connected to the first source electrode S1.

The second conductive layer may further include a data line that applies a data signal to another transistor. The data line may be connected to the source/drain electrodes of another transistor to transfer a signal applied from the data line.

The second interlayer dielectric layer IL2 is disposed on the second conductive layer. The second interlayer dielectric layer IL2 may act as an insulating layer between the second conductive layer and other layers disposed thereon. In addition, the second interlayer dielectric layer IL2 may cover the second conductive layer to protect it.

The third conductive layer is disposed on the second interlayer dielectric layer IL2. The third conductive layer may include a first voltage line VL1, a second voltage line VL2, and a first conductive pattern CDP. A high-level voltage (e.g., a first supply voltage) may be applied to the first voltage line VL1 to be supplied to the first transistor T1, and a low-level voltage (e.g., a second supply voltage) may be applied to the second voltage line VL2 to be supplied to the second electrode RME2.

The first voltage line VL1 and the second voltage line VL2 of the third conductive layer may extend in the second direction DR2. The first voltage line VL1 may include a portion extending in the second direction DR2 and then bent in another direction between the second direction DR2 and the first direction DR1. On the other hand, the second voltage line VL2 may not be bent but may extend in the second direction DR2. The first voltage line VL1 and the second voltage line VL2 may be disposed at such locations that they partially overlap the electrodes RME1, RME2, RME3, and RME4, described in more detail below, in the thickness direction. The first voltage line VL1 may be disposed such that it extends in the second direction DR2 at the border of the sub-pixel PXn and is partially bent and located in the emission area EMA. The second voltage line VL2 may be disposed to pass through the emission area EMA.

The first conductive pattern CDP may be connected to the second capacitor electrode CSE2 through a contact opening (e.g., a contact hole) formed in the second interlayer dielectric layer IL2. The second capacitor electrode CSE2 may be integrated with the first source electrode S1 of the first transistor T1, and thus, the first conductive pattern CDP may be electrically connected to the first source electrode S1. The first conductive pattern CDP may also contact the first electrode RME1, to be described in more detail below. The first transistor T1 may transfer a first supply voltage VDD applied from the first voltage line VL1 to the first electrode RME1 through the first conductive pattern CDP. Although the third conductive layer includes one second voltage line VL2 and one first voltage line VL1 in the example shown in the drawings, the present disclosure is not limited thereto. The third conductive layer may include more than one first voltage line VL1 and second voltage line VL2.

The buffer layer BL, the first gate insulating layer GI, the first interlayer dielectric layer IL1, and the second interlayer dielectric layer IL2 may include (or may be made up of) a plurality of inorganic layers alternately stacked on one another. For example, the buffer layer BL, the first gate insulating layer GI, the first interlayer dielectric layer IL1, and the second interlayer dielectric layer IL2 may include (or may be made up of) a plurality of layers in which inorganic layers including at least one of silicon oxide ($SiO_x$), silicon nitride ($SiN_x$), and silicon oxynitride (SiON) are alternately stacked on one another.

The first conductive layer, the second conductive layer, and the third conductive layer may include (or may be made up of) a single layer or multiple layers of one of molybdenum (Mo), aluminum (Al), chromium (Cr), gold (Au), titanium (Ti), nickel (Ni), neodymium (Nd) and copper (Cu) or an alloy thereof. It is, however, to be understood that the present disclosure is not limited thereto.

The third interlayer dielectric layer IL3 is disposed on the third conductive layer. The third interlayer dielectric layer IL3 may include an organic material (e.g., an organic insulating material), such as polyimide (PI), to provide a flat surface.

On the third interlayer dielectric layer IL3, a plurality of first banks BNL1, a plurality of electrodes RME, a light-emitting element ED, a plurality of contact electrodes CNE1 and CNE2, and a second bank BNL2 are disposed as a display element layer. In addition, a plurality of insulating layers PAS1, PAS2, and PAS3 may be disposed on the third interlayer dielectric layer IL3.

The plurality of first banks BNL1 may be disposed directly on the third interlayer dielectric layer IL3. One first bank BNL1 may have a shape extending in the first direction DR1 and may be disposed across other neighboring sub-pixels PXn. In addition, the first bank BNL1 may have a shape extending in the second direction DR2 and may be spaced apart from another first bank BNL1 disposed in the same sub-pixel PXn. For example, each of the first banks BNL1 may have a width (e.g., a predetermined width) in the first direction DR1 and the second direction DR2, and a part of the first banks BNL1 may be disposed in the emission area EMA and the other part thereof may be disposed at the border of another sub-pixel PXn adjacent thereto in the first direction DR1. The length of the first banks BNL1 in the second direction DR2 may be greater than the length of the emission area EMA in the second direction DR2 so that a part of the first banks BNL1 may overlap the second bank BNL2 in the non-emission area.

A plurality of first banks BNL1 may be disposed in one sub-pixel PXn. For example, two first banks BNL1 may be partially disposed in the emission area EMA of one sub-pixel PXn. The two first banks BNL1 may be spaced apart from each other in the first direction DR1. The light-emitting element ED may be disposed between the first banks BNL1 at where they are spaced apart from each other in the first direction DR1. Although the drawings show two first banks BNL1 disposed in the emission area EMA of each of the sub-pixels PXn to form an island-like pattern, the present disclosure is not limited thereto. The number of first banks BNL1 disposed in the emission area EMA of each sub-pixel PXn may vary depending on the number of the electrodes RME1 and RME2 or the arrangement of the light-emitting elements ED.

The first banks BNL1 may have a structure that at least partly protrudes from the upper surface of the third interlayer dielectric layer IL3. The protrusions of the first banks BNL1 may have inclined side surfaces. The light emitted from the light-emitting elements ED may be reflected by the electrodes RME disposed on the first banks BNL1 so that the light may exit toward the upper side of the third interlayer dielectric layer IL3. The first banks BNL1 may provide the area in which the light-emitting element ED is disposed and may also act as reflective walls that reflect light emitted from the light-emitting element ED upward. The side surfaces of the first banks BNL1 may be inclined in a linear shape, but the present disclosure is not limited thereto. In other embodiments, the first banks BNL1 may have a semicircle or semi-ellipse shape with a curved outer surface. The first banks BNL1 may include, but are not limited to, an organic insulating material, such as polyimide (PI).

The plurality of electrodes RME1 and RME2 have a shape extending in one direction and are disposed in each of the sub-pixels PXn. The plurality of electrodes RME1 and RME2 may have a shape extending in the second direction DR2 and spaced apart from each other in the first direction DR1 and/or the second direction DR2 to be disposed in each of the sub-pixels PXn. For example, the first electrode RME1 and the second electrode RME2 disposed in each of the sub-pixels PXn may be spaced apart from each other in the first direction DR1. A plurality of light-emitting elements ED may be disposed on the first electrode RME1 and the second electrode RME2. It is, however, to be understood that the present disclosure is not limited thereto. For example, the positions of the electrodes RME1 and RME2 disposed in each of the sub-pixels PXn may vary depending on their number or the number of light-emitting elements ED disposed in the sub-pixel PXn.

The first electrode RME1 and the second electrode RME2 may be disposed in the emission area EMA of each of the sub-pixels PXn, and a part thereof may extend beyond the emission area EMA to overlap the second bank BNL2 in the thickness direction. According to an embodiment of the present disclosure, the first electrode RME1 and the second electrode RME2 may extend in the second direction DR2 within each of the sub-pixels PXn, and may be spaced apart from the first electrode RME1 or the second electrode RME2 of another sub-pixel PXn adjacent thereto in the second direction DR2.

For example, the first electrode RME1 may extend from (e.g., extend from under) the second bank BNL2 disposed on one side (e.g., the upper side in FIG. 3) of the emission area EMA in the second direction DR2 to the opposite side in the second direction DR2 to reach the cut area CBA. In the cut area CBA, the first electrode RME1 may be spaced apart from an electrode pattern CP disposed in the respective sub-pixel PXn in the second direction DR2. The second electrode RME2 may extend from the second bank BNL2 disposed on the upper side of the emission area EMA to the opposite side in the second direction DR2 to extend beyond the cut area CBA. The second electrode RME2 may be disposed adjacent to the boundary with another sub-pixel PXn adjacent thereto in the second direction DR2.

The first electrode RME1 and the second electrode RME2 are similar in that they extend in the second direction DR2 but they may have different shapes. A part of the first electrode RME1 that overlaps the second bank BNL2 disposed on the upper side of the emission area EMA may be (e.g., may be formed as) a first electrode contact portion CTP1. A part of the second electrode RME2 that overlaps the second bank BNL2 disposed on the lower side of the cut area CBA to form the boundary with another adjacent sub-pixel PXn may be (e.g., may be formed as) a second electrode contact portion CTP2. The width of the portion of the first electrode RME1 that extends in the second direction DR2 in the emission area EMA may be equal to the width of the first electrode contact portion CTP1. The width of the portion of the second electrode RME2 that connects the portion extending in the second direction DR2 in the emission area EMA with the second electrode contact portion CTP2 may be relatively small. It is, however, to be understood that the present disclosure is not limited thereto.

According to an embodiment of the present disclosure, the first electrode RME1 and the second electrode RME2 may partially overlap the first voltage line VL1 and the second voltage line VL2 in the thickness direction, respectively. The electrodes RME1 and RME2, the first voltage line VL1, and the second voltage line VL2 may extend in the second direction DR2 where they overlap one another.

The plurality of electrodes RME1 and RME2 may be connected to the third conductive layer so that a signal for allowing the light-emitting element ED to emit light (e.g., a signal causing the light-emitting element ED to emit light) may be applied. The first electrode RME1 may contact the first conductive pattern CDP through a first contact opening (e.g., a first contact hole) CT1 that is formed at the first electrode contact portion CTP1 and penetrates through the third interlayer dielectric layer IL3 thereunder. The second electrode contact portion CTP2 of the second electrode RME2 may contact the second voltage line VL2 through a second contact opening (e.g., a second contact hole) CT2 that penetrates through the third interlayer dielectric layer IL3 thereunder. The first electrode RME1 may be electrically connected to the first transistor T1 through the first conductive pattern CDP to receive the first supply voltage. The second electrode RME2 may be electrically connected to the second voltage line VL2 to receive the second supply voltage. The plurality of electrodes RME1 and RME2 may be electrically connected to the light-emitting element ED. The electrodes RME1 and RME2 may be connected to both ends (e.g., may be respectively connected to opposite ends) of the light-emitting element ED through the contact electrodes CNE1 and CNE2, described in more detail below, and may transmit an electric signal applied from the third conductive layer to the light-emitting element ED. Because the electrodes RME1 and RME2 are disposed separately in each of the sub-pixels PXn, the light-emitting elements ED of different sub-pixels PXn may emit light individually.

Although the electrode contact portions CTP1 and CTP2 where the first contact opening CT1 and the second contact opening CT2 are formed, respectively, are formed at locations such that they overlap the second bank BNL2 in the drawings, the present disclosure is not limited thereto. For example, each of the electrode contact portions CTP1 and CTP2 may be located in the emission area EMA surrounded by (e.g., surrounded along a periphery by) the second bank BNL2.

The electrodes RME1 and RME2 disposed in each of the sub-pixels PXn may be disposed on a plurality of first banks BNL1 spaced apart from one another. The electrodes RME1 and RME2 may be disposed on one side of the first banks BNL1 in the first direction DR1, for example, on the inclined side surfaces of the first banks BNL1. According to an embodiment of the present disclosure, the width of the plurality of electrodes RME1 and RME2 in the first direction DR1 may be smaller than the width of the first banks BNL1 in the first direction DR1. Each of the electrodes RME1 and RME2 may be disposed to cover at least one side of the first banks BNL1 to reflect light emitted from the light-emitting element ED.

The spacing between the electrodes RME1 and RME2 spaced apart in the first direction DR1 may be smaller than the spacing between the first banks BNL1. At least a part of each of the electrodes RME1 and RME2 may be disposed directly on the third interlayer dielectric layer IL3 to be disposed on the same plane.

According to an embodiment of the present disclosure, the plurality of electrodes RME1 and RME2 may transmit an electrical signal for allowing the light-emitting element ED to emit light and may also be used to generate an electric field within the sub-pixels PXn to align the light-emitting element ED during the process of fabricating the display device 10. The light-emitting elements ED may be sprayed onto the electrodes RME1 and RME2 through an inkjet printing process. After an ink containing the light-emitting elements ED is sprayed, an alignment signal is applied to each of the electrodes RME1 and RME2 to generate an electric field. The light-emitting elements ED dispersed in the ink may receive (e.g., may move due to) an electrophoretic force caused by the generated electric field so that they may be aligned on the electrodes RME1 and RME2.

The electrodes RME1 and RME2 may be formed separately from sub-pixels PXn to sub-pixels PXn and may be electrically connected to the third conductive layer. The alignment signal for aligning the light-emitting elements ED during the process of fabricating the display device 10 may be applied through the third conductive layer, and an alignment signal may be applied to the electrodes RME1 and RME2 disposed separately in each of the sub-pixels PXn through the third conductive layer. The third conductive layer may be disposed under the third interlayer dielectric layer IL3 and may have a larger thickness than each of the electrodes RME1 and RME2. When the alignment signal is applied through the third conductive layer, the resistance of the lines (e.g., the conductive lines) is lower during the alignment process than when the alignment signal is applied directly to the electrodes RME1 and RME2, which are disposed in the plurality of sub-pixels PXn and are connected across the sub-pixels PXn. In addition, because the electric field formed by the alignment signals are not generated at or have a relatively weak intensity at the boundary between the electrodes RME1 and RME2 in the direction in which the neighboring sub-pixels PXn are adjacent each other, it is possible to prevent or substantially prevent the light-emitting elements ED from being are aligned at undesired locations and lost.

In some embodiments, an alignment signal for aligning the light-emitting elements ED may be directly applied through the first voltage line VL1 and the second voltage line VL2 without passing through the transistor. The alignment signal may be applied to the first voltage line VL1 and the second voltage line VL2, and the alignment signal may be transmitted to the first electrode RME1 and the second electrode RME2 connected thereto. It is to be noted that the first electrode RME1 may also be electrically connected to the first transistor T1 through the first conductive pattern CDP. During the process of fabricating the display device 10, an alignment signal may be applied by directly connecting the first electrode RME1 with the first voltage line VL1. During the process of fabricating the display device 10, the first electrode RME1 may be connected directly to the first voltage line VL1, and in a subsequent process, the first electrode RME1 may be separated from the first voltage line VL1. To this end, the electrode pattern CP may be disposed in each of the sub-pixels PXn of the display device 10, which is a part of the first electrode RME1 that was directly connected to the first voltage line VL1 and is then separated from it.

The electrode pattern CP may be directly connected to the first voltage line VL1 and may be spaced apart from the first electrode RME1. For example, the electrode pattern CP may be disposed outside the emission area EMA, may overlap the second bank BNL2, and may be spaced apart from the first electrode RME1 at the cut area CBA. During the process of fabricating the display device 10, the electrode pattern CP may be formed to be connected to the first electrode RME1, and the first electrode RME1 may be separated from the electrode pattern CP after the light-emitting elements ED are aligned. Accordingly, the first electrode RME1 may be electrically connected only to the first transistor T1, and the electrode pattern CP may remain electrically connected only to the first voltage line VL1. The electrode pattern CP will be described in more detail below with reference to other drawings.

Each of the electrodes RME1 and RME2 may include a conductive material having a high reflectance. For example, each of the electrodes RME1 and RME2 may include a metal, such as silver (Ag), copper (Cu), and aluminum (Al), as the material having a high reflectance and may be an alloy including aluminum (Al), nickel (Ni), lanthanum (La), etc. Each of the electrodes RME1 and RME2 may reflect light that is emitted from the light-emitting element ED toward the side surfaces of the first banks BNL1 toward the upper side of each of the sub-pixels PXn.

It is, however, to be understood that the present disclosure is not limited thereto. Each of the electrodes RME1 and RME2 may further include a transparent conductive material. For example, each of the electrodes RME1 and RME2 may include a material, such as ITO, IZO, and ITZO. In some embodiments, each of the electrodes RME1 and RME2 may have a structure in which one or more layers of a transparent conductive material and a metal layer having high reflectivity are stacked, or may be (may include) a single layer including them. For example, each of the electrodes RME1 and RME2 may have a stacked structure, such as ITO/Ag/ITO/, ITO/Ag/IZO, or ITO/Ag/ITZO/IZO.

The first insulating layer PAS1 is disposed on the electrodes RME1 and RME2 and the first banks BNL1. The first insulating layer PAS1 may be disposed to cover the first banks BNL1 and the first electrode RME1 and the second electrode RME2 while exposing a part of the upper surface of each of the first electrode RME1 and the second electrode RME2. Openings may be formed in the first insulating layer PAS1, via which a part of the upper surface of each of the electrodes RME1 and RME2 may be exposed. The contact electrodes CNE1 and CNE2 may contact the electrodes RME1 and RME2 through the openings.

In an embodiment, the first insulating layer PAS1 may have steps so that a part of the upper surface is recessed between the first electrode RME1 and the second electrode RME2. Because the first insulating layer PAS1 is disposed to cover the first electrode RME1 and the second electrode RME2, steps may be formed therebetween. It is, however, to be understood that the present disclosure is not limited thereto. The first insulating layer PAS1 protects the first electrode RME1 and the second electrode RME2 and insulates them from each other. In addition, the first insulating layer PAS1 can prevent the light-emitting element ED disposed on the first insulating layer PAS1 from contacting other elements and being damaged.

The second bank BNL2 may be disposed on the first insulating layer PAS1. The second bank BNL2 may be disposed in a lattice pattern, including portions extending in the first direction DR1 and the second direction DR2 when viewed from the top. The second bank BNL2 may be disposed along the border of each of the sub-pixels PXn to distinguish adjacent sub-pixels PXn from one another. In addition, the second bank BNL2 may be disposed to surround (e.g., to surround or extend around a periphery of) the emission area EMA and the cut area CBA disposed in each of the sub-pixels PXn to distinguish them. The part of the second bank BNL2 extending in the second direction DR2 may have a larger width between the emission areas EMA than between the cut areas CBA. The distance between the cut areas CBA may be smaller than the distance between the emission areas EMA.

The second bank BNL2 may have a height greater than a height of the first banks BNL1. The second bank BNL2 may prevent the ink in which the light-emitting elements ED are dispersed from overflowing into adjacent sub-pixels PXn during the inkjet printing process during the processes of fabricating the display device 10 so that different sub-pixels PXn can be separated from one another and the ink is not mixed between them. Because one first bank BNL1 is disposed across the sub-pixels PXn adjacent to each other in the first direction DR1, a part of the second bank BNL2 extending in the second direction DR2 may be disposed on the first bank BNL1. The second bank BNL2 may include, but is not limited to, polyimide (PI), similar to the first banks BNL1.

The light-emitting elements ED may be disposed on the first insulating layer PAS1. The light-emitting elements ED may be spaced apart from one another in the second direction DR2 in which the electrodes RME1 and RME2 extend and may be aligned substantially parallel to one another. The light-emitting elements ED may have a shape extending in one direction. The direction in which the electrodes RME1 and RME2 extend may be substantially perpendicular to the direction in which the light-emitting elements ED extend. It is, however, to be understood that the present disclosure is not limited thereto. The light-emitting elements ED may be oriented obliquely to the direction in which the electrodes RME1 and RME2 extend.

The light-emitting elements ED may include semiconductor layers doped to have different conductivity types. The light-emitting elements ED may include a plurality of semiconductor layers and may be aligned so that their ends are directed in a particular orientation depending on the direction of the electric field generated by the electrodes RME1 and RME2. In addition, each of the light-emitting elements ED may include an emissive layer 36 (see, e.g., FIG. 6) to emit light of a particular wavelength band. The light-emitting elements ED disposed in each of the sub-pixels PXn may emit light of different wavelength bands depending on the material of the emissive layer 36. It is, however, to be understood that the present disclosure is not limited thereto. The light-emitting elements ED disposed in the sub-pixels PXn may emit light of the same color.

The light-emitting elements ED may be disposed on the electrodes RME1 and RME2 between the first banks BNL1. For example, one end of each of the light-emitting elements ED may be located on the first electrode RME1, while the other end thereof may be located on the second electrode RME2. The length of the light-emitting elements ED may be larger than the distance between the first electrode RME1 and the second electrode RME2, and the ends of the light-emitting elements ED may be disposed on the first electrode RME1 and the second electrode RME2, respectively.

The light-emitting elements ED may include a plurality of semiconductor layers and may be disposed on the upper surface of the first substrate SUB. The light-emitting elements ED of the display device 10 may be arranged such that they extend in parallel to the first substrate SUB (e.g., parallel to the upper surface of the first substrate SUB). The semiconductor layers included in the light-emitting elements ED may be disposed sequentially in the direction parallel to the upper surface of the first substrate SUB. It is, however, to be understood that the present disclosure is not limited thereto. In some embodiments, when the light-emitting elements ED have a different structure, a plurality of layers may be disposed in a direction perpendicular to the first substrate SUB.

The ends of each of the light-emitting elements ED may contact the contact electrodes CNE1 and CNE2, respectively. The insulating layer 38 of the light-emitting element ED (see, e.g., FIG. 6) is not formed at the end surfaces on the sides thereof in the extending direction to expose part of the semiconductor layer, and the exposed part of the semiconductor layer may contact the contact electrode CNE1 and CNE2. It is, however, to be understood that the present disclosure is not limited thereto. In some embodiments, at least a part of the insulating layer 38 is removed or the insulating layer 38 is removed, so that the end surfaces of the semiconductor layers of the light-emitting element ED may be at least partially exposed. The exposed side surfaces of the semiconductor layer may contact the contact electrodes CNE1 and CNE2.

The second insulating layer PAS2 may be partially disposed on the light-emitting elements ED. For example, the second insulating layer PAS2 may be disposed to partially cover the outer surface of the light-emitting element ED so that the end and the other end of the light-emitting element ED are not covered (e.g., are exposed). The contact electrodes CNE1 and CNE2 may contact the both ends of the light-emitting element ED that not covered by the second insulating layer PAS2, which will be described in more detail below. The portion of the second insulating layer PAS2 that is disposed on the light-emitting element ED may extend in the second direction DR2 on the first insulating layer PAS1 when viewed from the top, thereby forming a linear or island-like pattern in each of the sub-pixels PXn. The second insulating layer PAS2 may protect the light-emitting elements ED and fix the light-emitting elements ED during the process of fabricating the display device 10.

The contact electrodes CNE1 and CNE2 may be disposed on the second insulating layer PAS2. The first contact electrode CNE1 and the second contact electrode CNE2 may be disposed on parts of the first electrode RME1 and the second electrode RME2, respectively. The first contact electrode CNE1 may be formed on the first electrode RME1, the second contact electrode CNE2 may be disposed on the second electrode RME2, and each of the first contact electrode CNE1 and the second contact electrode CNE2 may have a shape extending in the second direction DR2. The first contact electrode CNE1 and the second contact electrode CNE2 may be spaced apart from each other in the first direction DR1 and they may form a linear pattern inside the emission area EMA of each of the sub-pixels PXn.

In some embodiments, the widths of the first contact electrode CNE1 and the second contact electrode CNE2 in a direction may be smaller than the widths of the first electrode RME1 and the second electrode RME2 in the direction (e.g., in the same direction), respectively. The first contact electrode CNE1 and the second contact electrode CNE2 may contact the end and the other end of the light-emitting elements ED and may cover parts of the upper surface of each of the first electrode RME1 and the second electrode RME2, respectively.

The contact electrodes CNE1 and CNE2 may contact the light-emitting elements ED and the electrodes RME1 and RME2, respectively. The semiconductor layer of the light-emitting element ED is exposed at both end surfaces of the light-emitting element ED in the extending direction, and the first contact electrode CNE1 and the second contact electrode CNE2 may contact the light-emitting element ED at the exposed end surfaces where the semiconductor layer is exposed. One end of the light-emitting element ED may be electrically connected to the first electrode RME1 through the first contact electrode CNE1, and the other end thereof may be electrically connected to the second electrode RME2 through the second contact electrode CNE2.

Although one first contact electrodes CNE1 and one second contact electrode CNE2 are disposed in one sub-pixel PXn in the drawings, the present disclosure is not limited thereto. The numbers of the first contact electrodes CNE1 and the second contact electrode CNE2 may vary depending on the numbers of the first electrode RME1 and the second electrode RME2 disposed in each of the sub-pixels PXn.

The contact electrodes CNE1 and CNE2 may include a conductive material. For example, the contact electrodes CNE1 and CNE2 may include ITO, IZO, ITZO, aluminum (Al), etc. For example, the contact electrodes CNE1 and CNE2 may include a transparent conductive material, and light emitted from the light-emitting elements ED may transmit through the contact electrodes CNE1 and CNE2 to propagate toward the electrodes RME1 and RME2. It is, however, to be understood that the present disclosure is not limited thereto.

In some embodiments, an insulating layer may be disposed on the contact electrodes CNE1 and CNE2 and the second bank BNL2 to cover them. The insulating layer may be disposed entirely on the first substrate SUB to protect the elements disposed thereon against the external environment.

Each of the first insulating layer PAS1 and the second insulating layer PAS2 may include an inorganic insulating material or an organic insulating material. According to an embodiment of the present disclosure, the first insulating layer PAS1 and the second insulating layer PAS2 may include an inorganic insulating material, such as silicon oxide ($SiO_x$), silicon nitride ($SiN_x$), silicon oxynitride ($SiO_xN_y$), aluminum oxide ($Al_2O_3$), and aluminum nitride (AlN). In some embodiments, the first insulating layer PAS1 and the second insulating layer PAS2 may include an organic insulating material, such as an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc. It is, however, to be understood that the present disclosure is not limited thereto.

As mentioned above, the display device 10 according to an embodiment may include the electrode pattern CP that is separated at the cut area CBA and disposed in the non-emission area or under the second bank BNL2.

Figure 5:
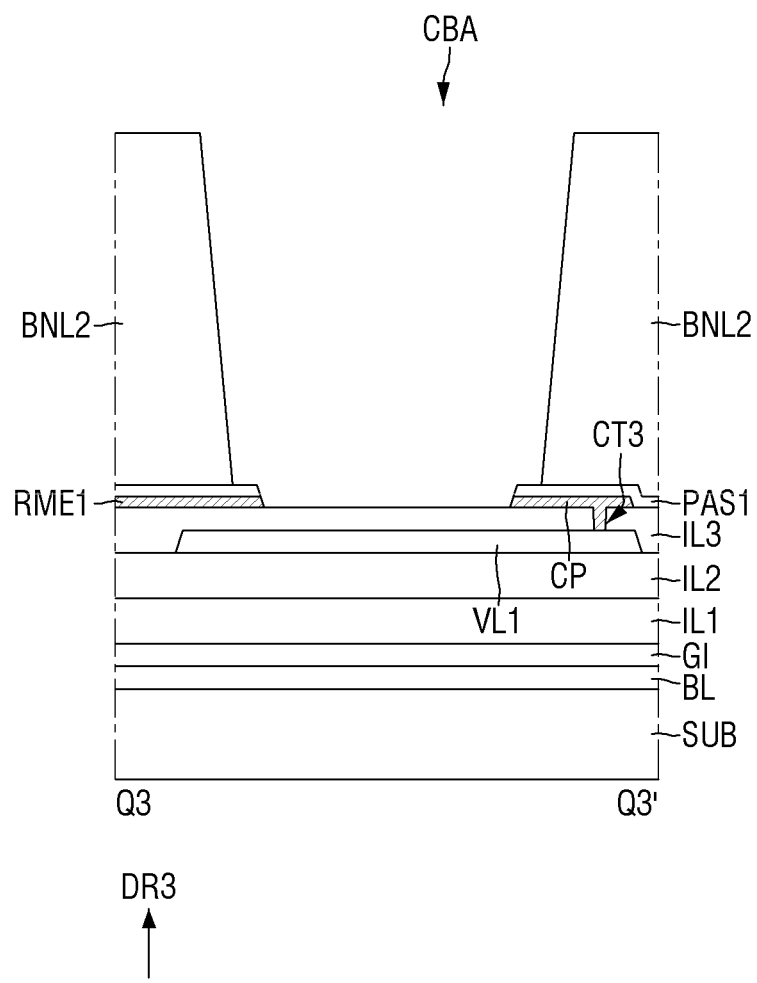
FIG. 5 is a cross-sectional view taken along the line Q3-Q3' in FIG. 3.

FIG. 5 is a cross-sectional view taken along the line Q3-Q3' in FIG. 3. FIG. 5 shows a cross section between the electrode pattern CP and the first electrode RME1 spaced apart from the electrode pattern CP.

Referring to FIG. 5, in connection with FIG. 3, the display device 10 according to an embodiment may include the electrode pattern CP that is disposed in each of the sub-pixels PXn and is separated from the first electrode RME1. Each of the sub-pixels PXn may include the emission area EMA and the cut area CBA, and the electrode pattern CP may be separated from the first electrode RME1 at the cut area CBA. For example, the electrode pattern CP may be spaced apart from the first electrode RME1 in the second direction DR2 in which the first electrode RME1 extends in the cut area CBA. The electrode pattern CP may be formed to be connected to the first electrode RME1 and may be disconnected therefrom at the cut area CBA.

According to an embodiment of the present disclosure, the electrode pattern CP may be disposed to overlap the first voltage line VL1 in the third direction DR3 (e.g., the thickness direction). The electrode pattern CP may contact the first voltage line VL1 through a third contact opening (e.g., a third contact hole) CT3 penetrating through the third interlayer dielectric layer IL3. An electrical signal applied to the first voltage line VL1 may be transmitted to the electrode pattern CP. During the process of fabricating the display device 10, an alignment signal may be transmitted through the first voltage line VL1 and applied to the first electrode RME1, and a first supply voltage may be transmitted to the first electrode RME1 while the display device 10 is driven.

The electrode pattern CP is a trace (e.g., an electrical trace) separated from the first electrode RME1 and may have a shape in consideration of connection with the first voltage line VL1. For example, the electrode pattern CP may include a first portion in the third contact hole CT3, and a second portion which is connected to the first portion with a different width and is separated from the first electrode RME1. At least the first portion of the electrode pattern CP may overlap the first voltage line VL1, and the second portion thereof may have the same width as the first electrode RME1 from which it is separated. It is, however, to be understood that the present disclosure is not limited thereto. The electrode pattern CP may substantially have a shape including only the first portion connected to the first voltage line VL1.

The electrode pattern CP may not overlap the first banks BNL1, different from the first electrode RME1. The electrode pattern CP may be disposed at a location spaced apart from the first electrode RME1 in the second direction DR2 (e.g., in the direction in which the first electrode RME1 extends) and may be disposed directly on a part of the third interlayer dielectric layer IL3 at where the first bank BNL1 is not disposed.

As will be described in more detail below, a process of separating the first electrode RME1 from the electrode pattern CP in the cut area CBA may be carried out after aligning the light-emitting elements ED and forming the second insulating layer PAS2. The second insulating layer PAS2 may be disposed in the emission area EMA but not in the cut area CBA, and only the electrodes RME1 and RME2 and the first insulating layer covering them may be disposed in the cut area CBA. When the first electrode RME1 is separated from the electrode pattern CP, a part of the first insulating layer PAS1 disposed thereon may also be removed. As a result, the separated side surfaces of the first electrode RME1 and the electrode pattern CP may be aligned with the side surfaces of the first insulating layer PAS1, respectively, in the cut area CBA. The third interlayer dielectric layer IL3 may be exposed between the first electrode RME1 and the electrode pattern CP, which are separated from each other. According to an embodiment of the present disclosure, the electrode pattern CP is formed via a process of separating it from the first electrode RME1 in the cut area CBA during the process of fabricating the display device 10 and, thus, may be disposed outside the cut area CBA, for example, outside the emission area EMA.

During the process of fabricating the display device 10, an alignment signal applied to the first voltage line VL1 may be transmitted to the first electrode RME1 through the electrode pattern CP, and an alignment signal applied to the second voltage line VL2 may be transmitted directly to the second electrode RME2. When the light-emitting elements ED are disposed on the electrodes RME1 and RME2, a process of separating the first electrode RME1 from the electrode pattern CP so that the signal applied to the first voltage line VL1 is not directly transmitted to the first electrode RME1. According to an embodiment of the present disclosure, the separation process is performed in the cut area CBA of each of the sub-pixels PXn, and the electrode pattern CP may remain such that it overlaps with the second bank BNL2. Compared to a conventional display device in which an alignment signal is applied directly to the connected electrodes that are disposed in a plurality of sub-pixels, when the alignment signal is applied through the third conductive layer in the display device 10, which has a relatively low line resistance, issues of heat generation by applied signals and voltage drop in an alignment signal may be mitigated or avoided. In addition, because the electric field formed by the alignment signals is not generated or has a relatively weak intensity at the boundary between the electrodes RME1 and RME2 in the direction in which the neighboring sub-pixels PXn are adjacent each other, it is possible to prevent or substantially prevent the light emitting elements ED from being aligned at undesired locations.

Figure 6:
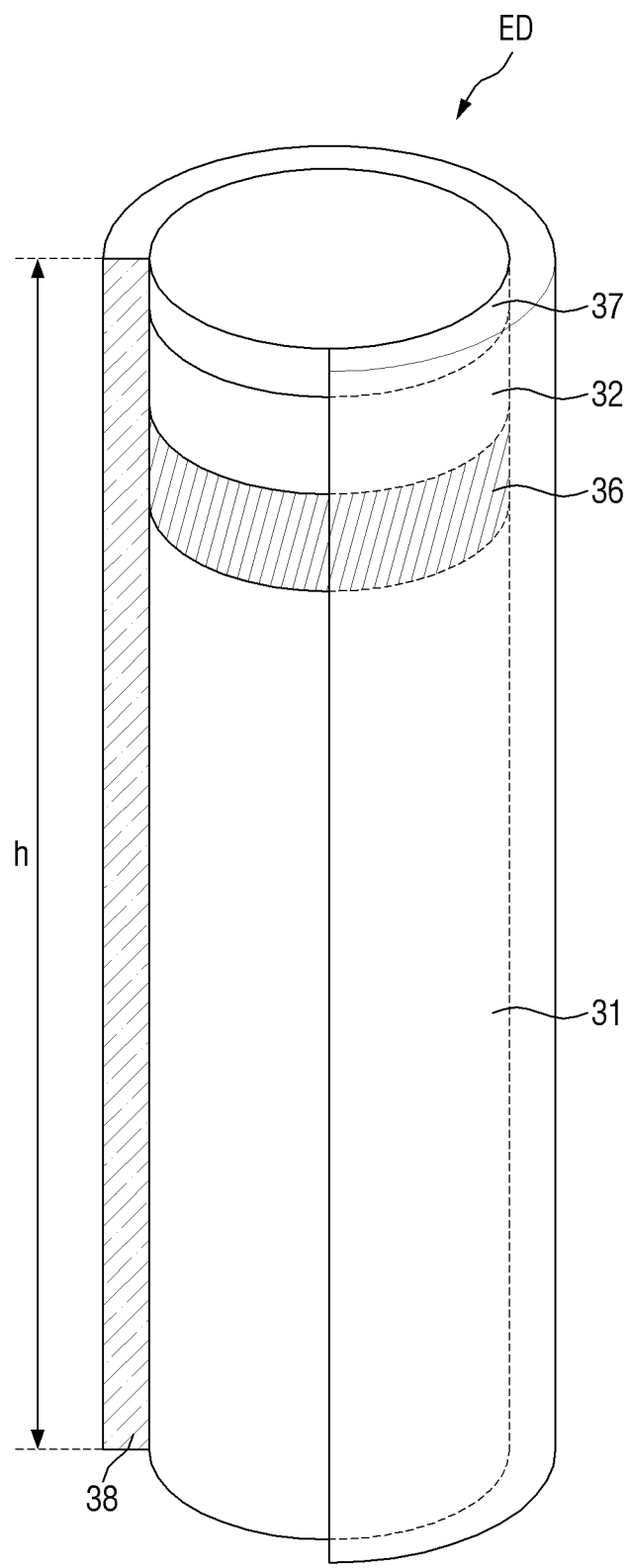
FIG. 6 is a schematic illustration of a light-emitting element according to an embodiment of the present disclosure.

FIG. 6 is a schematic view showing a light-emitting element according to an embodiment of the present disclosure.

The light-emitting elements ED may be light-emitting diodes. For example, the light-emitting elements ED may have a micrometer or nanometer size (e.g., a size in micrometers or nanometers) and may be inorganic light-emitting diodes including (or made of) an inorganic material. Inorganic light-emitting diodes may be aligned between two electrodes facing each other due to polarities created by forming an electric field in a direction (e.g., a particular direction) between the two electrodes. For example, the light-emitting elements ED may be aligned between the two electrodes by an electric field formed between the two electrodes.

The light-emitting element ED according to an embodiment may have a shape extending in one direction. The light-emitting element ED may have a cylindrical shape, a rod shape, a wire shape, a tube shape, etc. But it is to be understood that the shape of the light-emitting element ED is not limited thereto. The light-emitting element ED may have a variety of suitable shapes including a polygonal column shape, such as a cube, a cuboid, and a hexagonal column, or a shape that extends in a direction with partially inclined outer surfaces. The plurality of semiconductors included in the light-emitting element ED, described in more detail below, may have a structure sequentially arranged or stacked along the one direction.

The light-emitting element ED may include a semiconductor layer doped with impurities of a conductive type (e.g., p-type or n-type). The light-emitting element ED may emit light of a certain wavelength band by transmitting an electric signal applied from an external power source.

As shown in FIG. 6, the light-emitting element ED may include a first semiconductor layer 31, a second semiconductor layer 32, an emissive layer 36, an electrode layer 37, and an insulating layer 38.

The first semiconductor layer 31 may be an n-type semiconductor. When the light-emitting element ED emits light of a blue wavelength band, the first semiconductor layer 31 may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of n-type doped AlGaInN, GaN, AlGaN, InGaN, AlN, and InN. The first semiconductor layer 31 may be doped with an n-type dopant, and the n-type dopant may be Si, Ge, Sn, etc. For example, the first semiconductor layer 31 may be n-GaN doped with n-type Si. The length of the first semiconductor layer 31 may be in a range, but is not limited to, from about 1.5 μm to about 5 μm. A first end of the light-emitting element ED may refer to one side of the emissive layer 36 at where the first semiconductor layer 31 is disposed.

The second semiconductor layer 32 is disposed on the emissive layer 36. The second semiconductor layer 32 may be a p-type semiconductor. When the light-emitting element ED emits light of a blue or green wavelength band, the second semiconductor layer 32 may include a semiconductor material having the following chemical formula: $Al_xGa_yIn_{1-x-y}N$ ($0 \leq x \leq 1$, $0 \leq y \leq 1$, $0 \leq x+y \leq 1$). For example, it may be at least one of p-type doped AlGaInN, GaN, AlGaN, InGaN, AlN, and InN. The second semiconductor layer 32 may be doped with a p-type dopant, and the p-type dopant may be Mg, Zn, Ca, Se, Ba, etc. For example, the second semiconductor layer 32 may be p-GaN doped with p-type Mg. The length of the second semiconductor layer 32 may be in a range, but is not limited to, from about 0.05 μm to about 0.10 μm. A second end of the light-emitting element ED may refer to the other side of the emissive layer 36 at where the second semiconductor layer 32 is disposed.

Although each of the first semiconductor layer 31 and the second semiconductor layer 32 is shown as a signal layer in the drawings, the present disclosure is not limited thereto. Depending on the material of the emissive layer 36, the first semiconductor layer 31 and the second semiconductor layer 32 may further include a plurality of layers, such as a clad layer or a tensile strain barrier reducing (TSBR) layer.

The emissive layer 36 is disposed between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light when electron-hole pairs are combined therein in response to an electrical signal applied through the first semiconductor layer 31 and the second semiconductor layer 32. When the emissive layer 36 emits light of the blue wavelength band, it may include a material such as AlGaN and AlGaInN. In some embodiments, when the emissive layer 36 has a multi-quantum well structure in which quantum layers and well layers are alternately stacked on one another, the quantum layers may include AlGaN or AlGaInN, and the well layers may include a material, such as GaN and AlGaN. For example, the emissive layer 36 may include AlGaInN as the quantum layer and AlInN as the well layer, and, as described above, the emissive layer 36 may emit blue light having a center (or central) wavelength band of about 450 nm to about 495 nm.

It is, however, to be understood that the present disclosure is not limited thereto. The emissive layer 36 may have a structure in which a semiconductor material having a large band gap energy and a semiconductor material having a small band gap energy are alternately stacked on one another and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some embodiments. The length of the emissive layer 36 may be, but is not limited to, in the range of about 0.05 µm to about 0.10 µm.

The light emitted from the emissive layer 36 may exit not only through the outer surfaces of the light-emitting element ED in the longitudinal direction but also through the both side surfaces. That is, the direction in which the light emitted from the emissive layer 36 propagates is not limited to one direction.

The electrode layer 37 may be an ohmic contact electrode. It is, however, to be understood that the present disclosure is not limited thereto. The electrode layer may be a Schottky contact electrode. The light-emitting element ED may include at least one electrode layer 37. Although the light-emitting element ED includes one electrode layer 37 in the example shown in FIG. 6, the present disclosure is not limited thereto. In some embodiments, the light-emitting element ED may include a greater number of electrode layers 37 or the electrode layer may be omitted. The following description of the light-emitting element ED may be equally applied even when the number of electrode layers 37 is different or when the light-emitting element ED further includes other structures.

The electrode layer 37 can reduce the resistance between the light-emitting element ED and the electrodes or the contact electrodes when the light-emitting element ED is electrically connected to the electrodes or the contact electrodes in the display device 10 according to the embodiment of the present disclosure. The electrode layer 37 may include a conductive metal. For example, the electrode layer 37 may include at least one of aluminum (Al), titanium (Ti), indium (In), gold (Au), silver (Ag), ITO, IZO, and ITZO. In addition, the electrode layer 37 may include a semiconductor material doped with n-type or p-type impurities. The electrode layer 37 may include the same material as the corresponding semiconductor layer or may include different materials. It is, however, to be understood that the present disclosure is not limited thereto.

The insulating layer 38 is disposed to surround the outer surfaces of the plurality of semiconductor layers and electrode layers described above. For example, the insulating layer 38 may be disposed to surround (e.g., to extend around) at least the outer surface of the emissive layer 36 and may extend in a direction in which the light-emitting element ED extends. The insulating layer 38 may protect the above-described elements. The insulating layer 38 may be formed to surround the side surfaces of the elements while exposing both ends of the light-emitting element ED in the longitudinal direction.

Although the insulating layer 38 is shown as extending in the longitudinal direction of the light-emitting element ED to cover it from the first semiconductor layer 31 to the side surface of the electrode layer 37, the present disclosure is not limited thereto. The insulating layer 38 may cover only the outer surface of a part of the semiconductor layer, including the emissive layer 36, or may cover only a part a part of the outer surface of the electrode layer 37 to partially expose the outer surface of the electrode layer 37. In addition, a part of the upper surface of the insulating layer 38 which is adjacent to at least one end of the light-emitting element ED may be rounded in cross-sectional view.

The thickness of the insulating layer 38 may be, but is not limited to, in the range of 10 nm to 1.0 µm. Preferably, the thickness of the insulating layer 38 may be approximately 40 nm.

The insulating layer 38 may include materials having insulating properties, such as silicon oxide ($SiO_x$), silicon nitride ($SiN_x$), silicon oxynitride ($SiO_xN_y$), aluminum nitride (AlN), and aluminum oxide ($Al_2O_3$). Accordingly, an electrical short-circuit may be prevented when the emissive layer 36 contacts an electrode through which an electric signal is transmitted to the light-emitting element ED. In addition, because the insulating layer 38 includes the emissive layer 36 to protect the outer surface of the light-emitting element ED, a decrease in luminous efficiency may be prevented.

In addition, the outer surface of the insulating layer 38 may be subjected to surface treatment. The light-emitting elements ED may be dispersed in an ink, and the ink may be sprayed onto the electrode. A surface treatment may be applied to the insulating layer 38 so that it becomes hydrophobic or hydrophilic to keep the light-emitting elements ED dispersed in the ink from aggregating with one another. For example, the outer surface of the insulating layer 38 may be subjected to surface treatment with a material, such as stearic acid and 2,3-naphthalene dicarboxylic acid.

The length h of the light-emitting elements ED may be in a range from about 1 µm to about 10 µm, from about 2 µm to about 6 µm, or about 3 µm to about 5 µm. In addition, the diameter of the light-emitting elements ED may be in a range from about 30 nm to about 700 nm, and the aspect ratio of the light-emitting elements ED may be in a range from about 1.2 to about 100. It is, however, to be understood that the present disclosure is not limited thereto. The plurality of light-emitting elements ED included in the display device 10 may have different diameters depending on compositional differences of the emissive layer 36. For example, the diameter of the light-emitting elements ED may be about 500 nm.

Hereinafter, processing steps of fabricating the display device 10 will be described with reference to other drawings.

FIGS. 7 to 12 are schematic views showing processing steps of fabricating a display device according to an embodiment of the present disclosure. In the following description, a processing sequence of fabricating the display device 10 will be described in detail while some descriptions of the stacking method and the structure of each element may be omitted for clarity.

Figure 7:
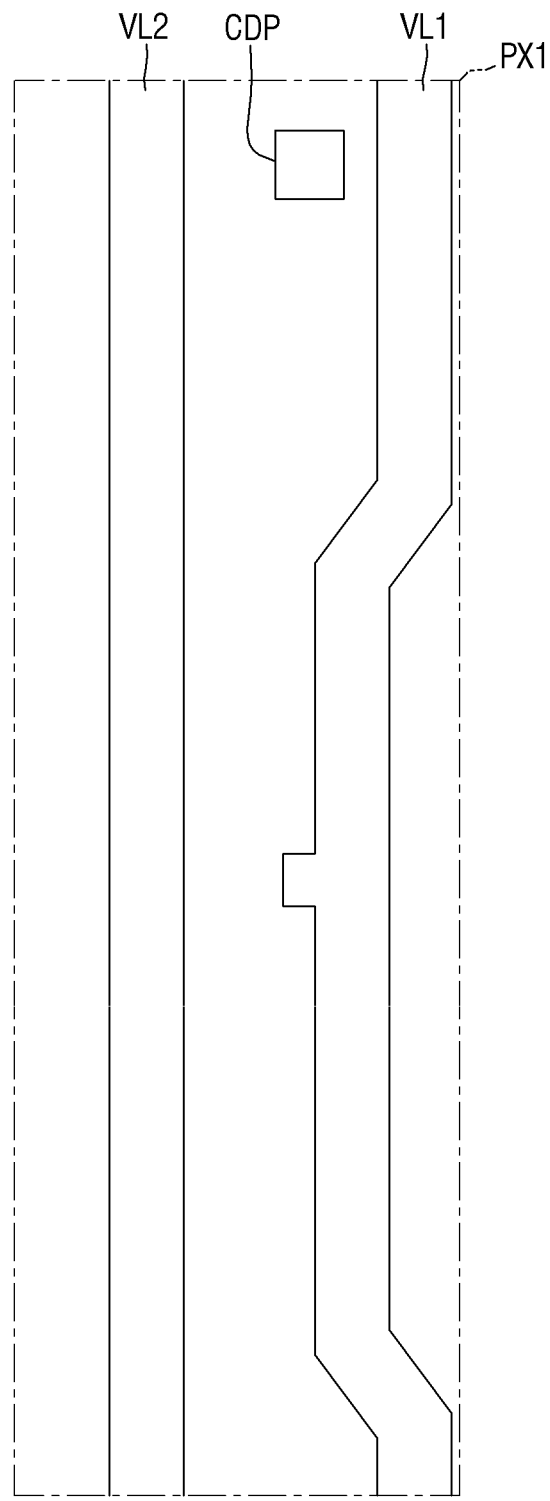
FIGS. 7 to 12 are schematic illustrations of processing steps of fabricating a display device according to an embodiment of the present disclosure.

Initially, referring to FIG. 7, a first substrate SUB is prepared and a circuit layer is formed on the first substrate SUB. The circuit layer includes a plurality of conductive layers and a semiconductor layer and includes a plurality of transistors for driving the sub-pixels PXn. FIG. 7 shows a first voltage line VL1, a second voltage line VL2, and a first conductive pattern CDP formed as a third conductive layer. The plurality of conductive layers and the semiconductor layer may be formed via a process of forming a layer including a depositing a material and then patterning it.

Subsequently, referring to FIGS. 8 and 9, a third interlayer dielectric layer IL3 is formed on the third conductive layer, and first banks BNL1, a first electrode RME1, a second electrode RME2, the first insulating layer PAS1 and a second bank BNL2 are formed on the third interlayer dielectric layer IL3. The first banks BNL1 and the second bank BNL2 may be disposed as described above. The first banks BNL1 may be disposed across adjacent sub-pixels PXn in the first direction DR1 to form an island-like pattern on the entire surface of the display area DPA. The second bank BNL2 is disposed to surround the emission area EMA and the cut area CBA.

The first electrode RME1 and the second electrode RME2 may extend in the second direction DR2. Each of the first electrode RME1 and the second electrode RME2 may traverse (or extend across) the emission area EMA and the cut area CBA but may not extend beyond the boundaries with other sub-pixels PXn adjacent thereto 195769/306474 in the second direction DR2. For example, in the display device 10 according to an embodiment of the present disclosure, the electrodes RME1 and RME2 may be separated from the electrodes RME1 and RME2 of neighboring (or adjacent) sub-pixels PXn, respectively, and may be disposed only within the respective sub-pixel PXn. The electrodes RME1 and RME2 in each of the sub-pixels PXn may form an island-like or linear pattern on the entire surface of the display area DPA.

A part (or portion) of the first electrode RME1 that overlaps the second bank BNL2 located on the upper side (with respect to drawings) of the emission area EMA is formed as a first electrode contact portion CTP1 to connect the first electrode RME1 with a circuit layer thereunder, for example, the first conductive pattern CDP. The second electrode RME2 may extend from the emission area EMA to the cut area CBA. A part (or portion) of the second electrode RME2 that overlaps the second bank BNL2 located on the lower side (with respect to the drawings) of the cut area CBA is formed as a second electrode contact portion CTP2. The second contact portion CTP2 may contact a circuit layer thereunder, for example, the second voltage line VL2. The electrode pattern CP may be formed to overlap the second bank BNL2 located on the lower side of the cut area CBA and may contact a circuit layer thereunder, for example, the first voltage line VL1.

Figure 8:
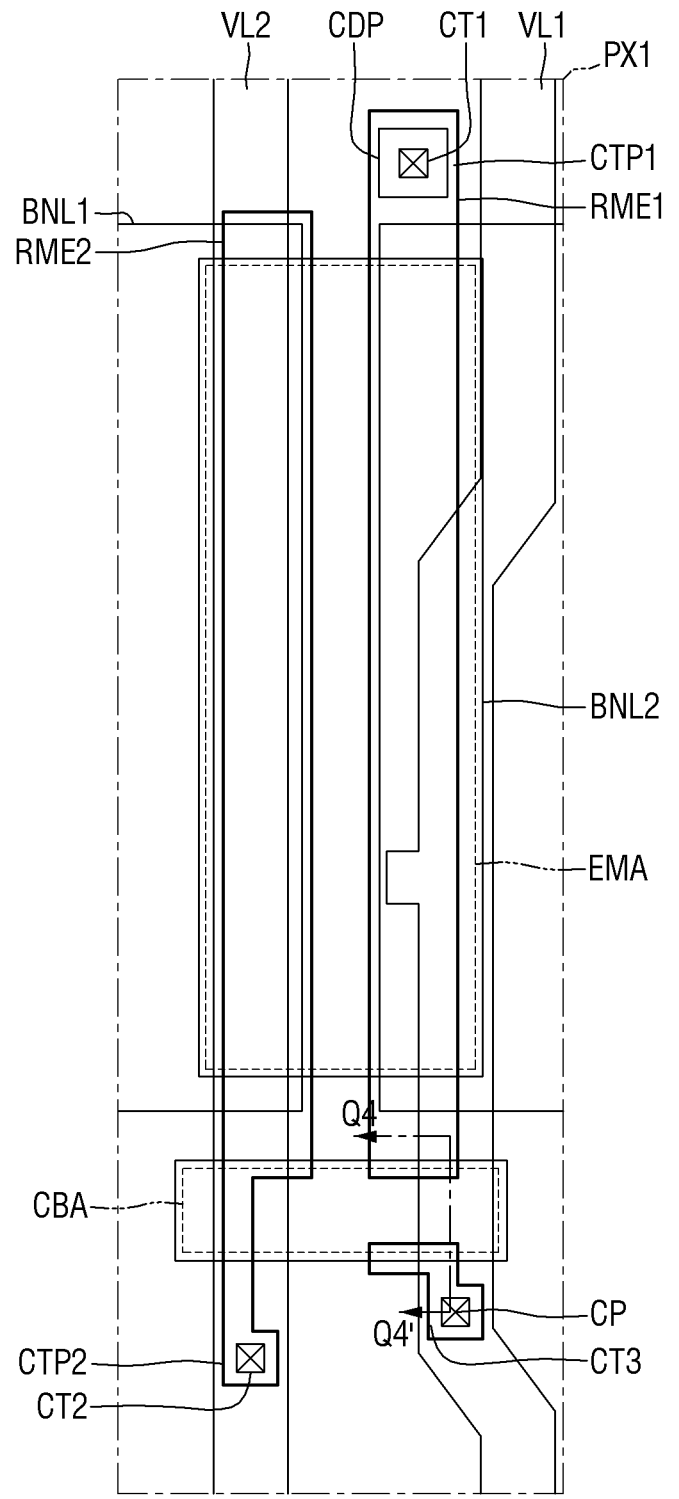
Figure 9:
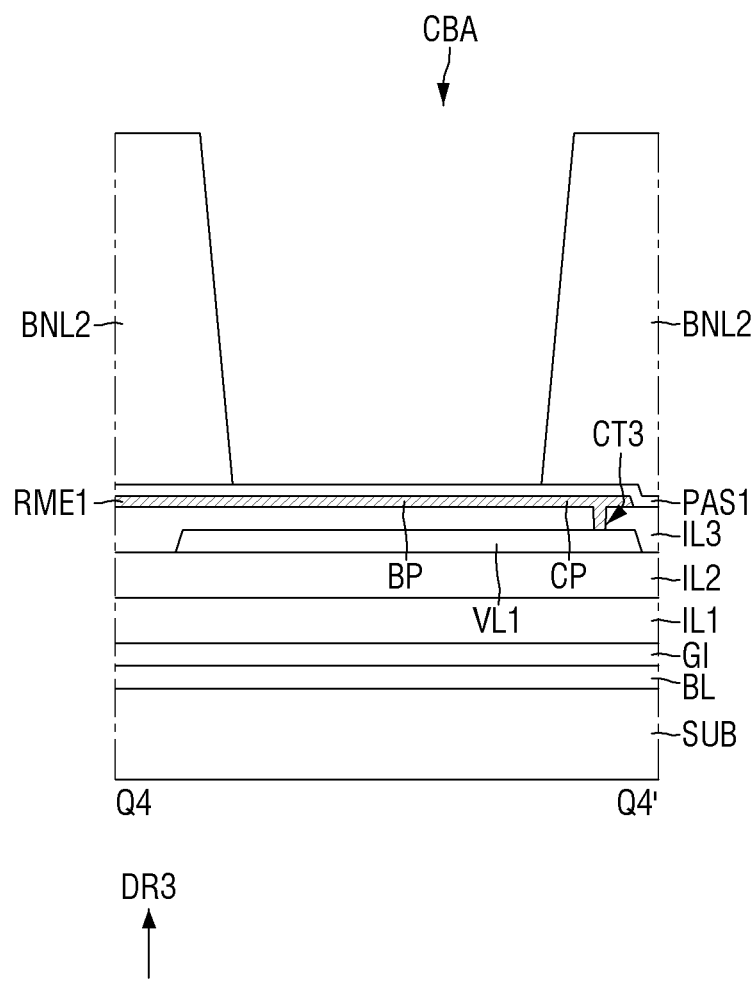

Referring to FIG. 9, which shows a cross section taken along the line Q4-Q4' in FIG. 8, the first electrode RME1 is connected to the electrode pattern CP through the connection portion BP in the cut area CBA. During the process of fabricating the display device 10, the first electrode RME1 and the electrode pattern CP are connected to each other through the connection portion BP, and thus, an alignment signal applied to the first voltage line VL1 can be transmitted to the first electrode RME1 through the electrode pattern CP and the connection portion BP. The first electrode RME1 and the second electrode RME2 may be electrically connected to the first voltage line VL1 and the second voltage line VL2, respectively, and may be utilized to generate an electric field in each of the sub-pixels PXn during the process of aligning the light-emitting elements ED.

Figure 10:
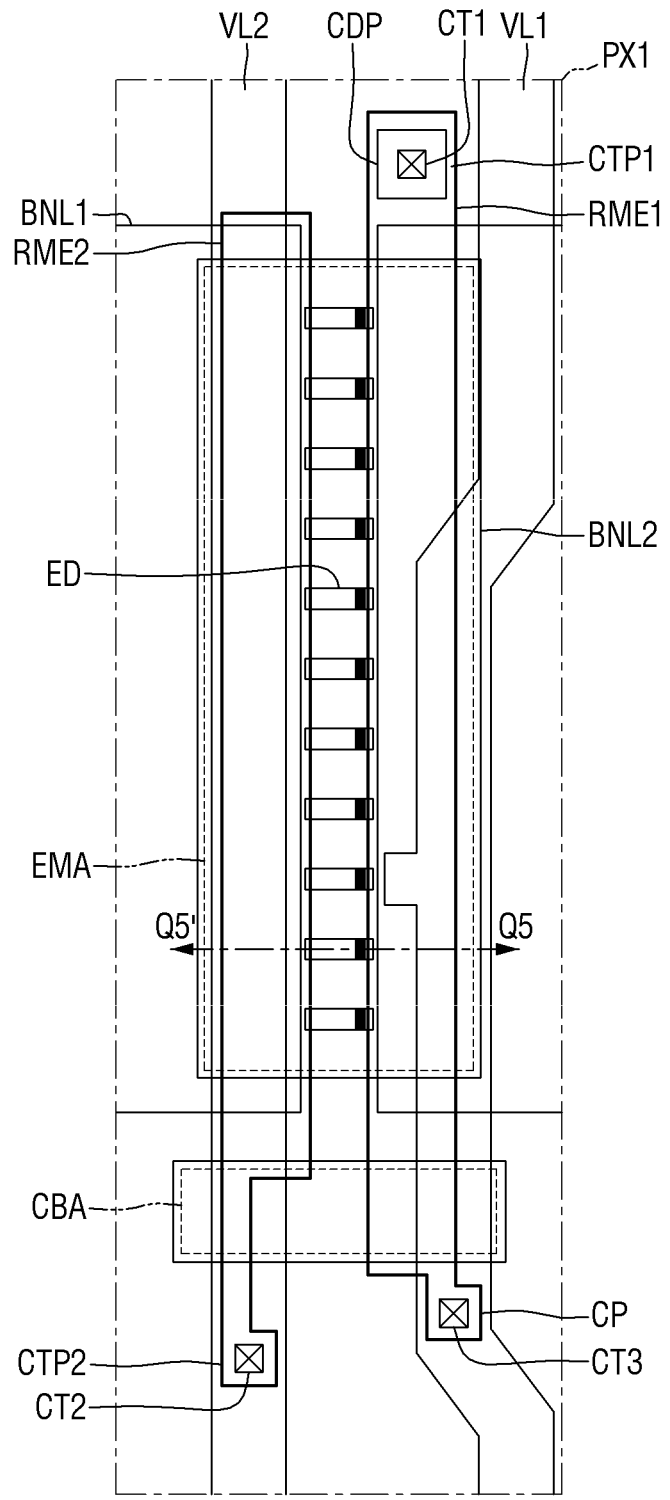
Figure 11:
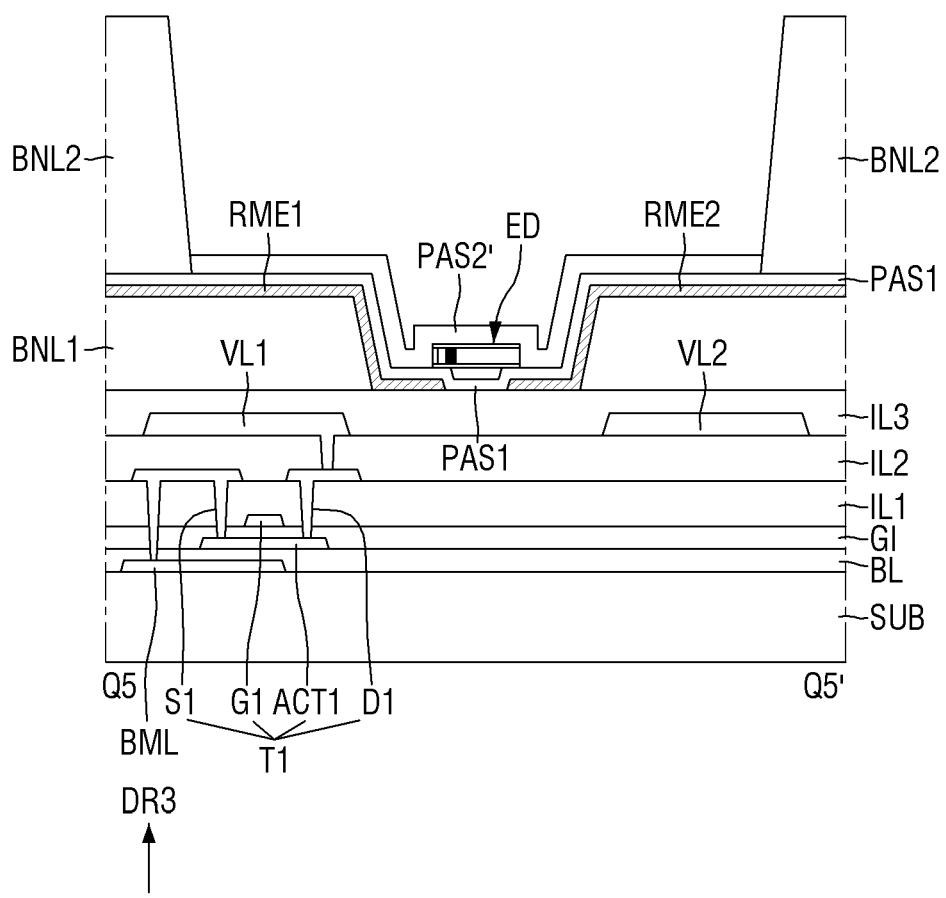

Subsequently, referring to FIGS. 10 and 11, a plurality of light-emitting elements ED is disposed on the first electrode RME1 and the second electrode RME2, and a second insulating layer PAS2' is formed thereon to fix the light-emitting elements ED. According to an embodiment of the present disclosure, an ink is prepared, in which the light-emitting elements ED are dispersed, and the ink may be sprayed onto the emission area EMA via an inkjet printing process. The second bank BNL2 may prevent or substantially prevent the ink from overflowing into the emission areas of adjacent sub-pixels PXn. When the ink is sprayed onto the emission area EMA, an alignment signal is applied to the first voltage line VL1 and the second voltage line VL2 to generate the electric field between the electrodes RME1 and RME2. The light-emitting elements ED dispersed in the ink may receive an (or may be acted upon be an) electrophoretic force caused by the electric field, and thus, their locations and orientations are changed so that their ends may be respectively aligned on the electrodes RME1 and RME2

According to an embodiment of the present disclosure, during the process of fabricating the display device 10, an alignment signal for aligning the light-emitting elements ED may be applied to the first voltage line VL1 and the second voltage line VL2 of the third conductive layer. The electrodes RME1 and RME2 of each of the plurality of sub-pixels PXn are formed to be separated from each other (e.g., are separate from each other) and may be electrically connected to the first voltage line VL1 and the second voltage line VL2, respectively. The first electrode RME1 may be connected to the electrode pattern CP connected to the first voltage line VL1 through the connection portion BP, and the second electrode RME2 may be connected directly to the second voltage line VL2. When the alignment signal is applied to the first voltage line VL1 and the second voltage line VL2, the electric field can be generated (e.g., concurrently or simultaneously generated) over the electrodes RME1 and RME2 disposed in each of the plurality of sub-pixels PXn, and the light-emitting elements ED may be aligned in each of the sub-pixels PXn. According to an embodiment of the present disclosure, because the alignment signal is applied through the third conductive layer, which has a low line resistance, different from a conventional a display device in which an alignment signal is applied directly to the connected electrodes RME1 and RME2 disposed in a plurality of sub-pixels, issues of heat generation due to the applied signals and voltage drop in an alignment signal can be prevented or mitigated.

Once the light-emitting elements ED are disposed, a second insulating layer PAS2' is formed to fix them. Referring to FIG. 11, which shows a cross section taken along the line Q5-Q5' in FIG. 10, the second insulating layer PAS2' may cover the light-emitting element ED and may be disposed on the first insulating layer PAS1 in the emission area EMA. The light-emitting element ED may be covered by the second insulating layer PAS2' to fix its position on the electrodes RME1 and RME2 after it is aligned. Thus, the positions of the light-emitting elements ED may not be changed or substantially changed during a subsequent process for forming the contact electrodes CNE1 and CNE2 after they are aligned.

Figure 12:
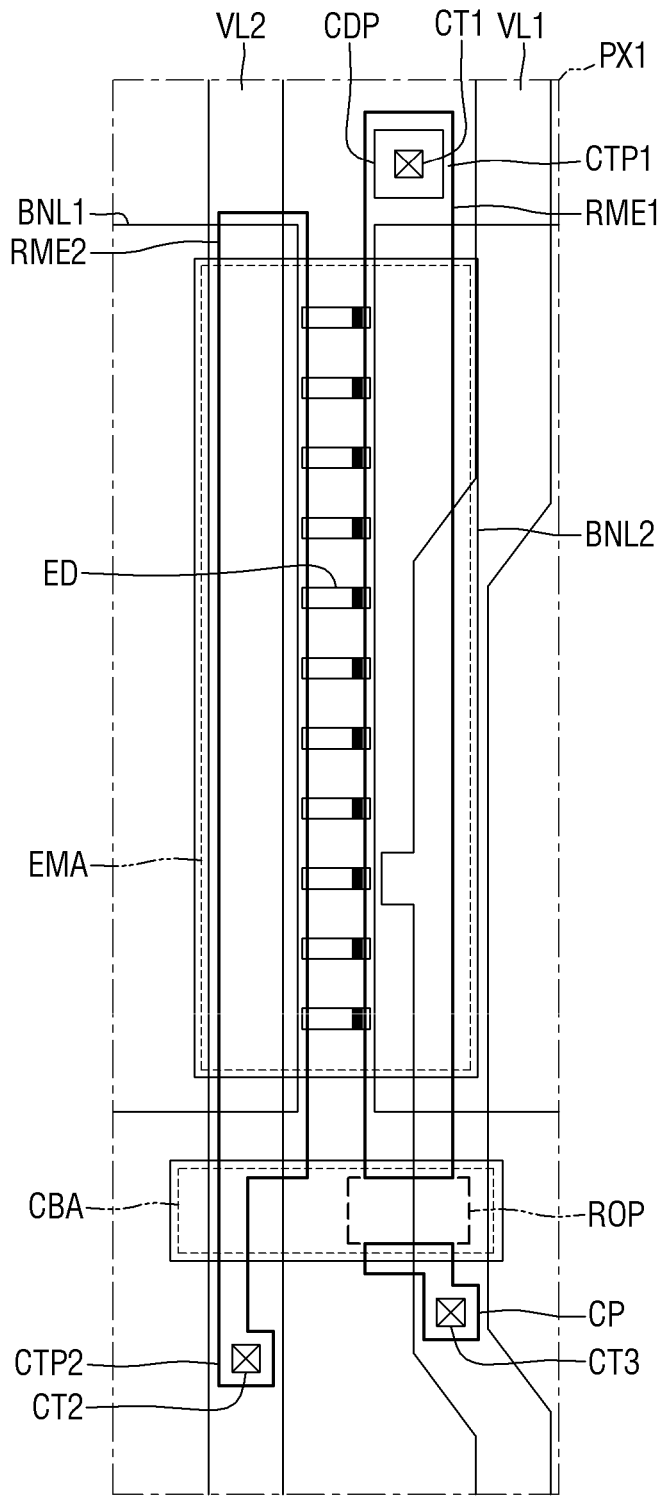

Subsequently, referring to FIG. 12, a process of removing the connection portion BP, which connects the first electrode RME1 and the electrode pattern CP, at the cut area CBA to separate the first electrode RME1 from the first voltage VL1 is carried out. The process of separating the first electrode RME1 from the first voltage VL1 may include removing the connection portion BP disposed in an electrode separation portion ROP of the cut area CBA. Because the electrode pattern CP, which is directly connected between the first voltage line VL1 and the first electrode RME1, is separated from the first electrode RME1 during this process, the first electrode RME1 may be connected to only the first transistor T1 through the first electrode contact portion CTP1. During the process of fabricating the display device 10, an alignment signal applied to the first voltage line VL1 may be transmitted to the first electrode RME1 through the electrode pattern CP, while a first supply voltage applied to the first voltage line VL1 may be transmitted to the first transistor T1 of the sub-pixels PXn. For example, while the alignment signal is applied (e.g., is concurrently or simultaneously applied) to the first electrodes RME1 disposed in the plurality of sub-pixels PXn during the fabrication process, the first electrodes RME1 can be driven individually by the first transistors T1 of the respective sub-pixels PXn during driving the display device 10.

Then, a part of the second insulating layer PAS2' is removed so that both ends of the light-emitting element ED are exposed to form the second insulating layer PAS2, and the contact electrodes CNE1 and CNE2 are formed to contact the light-emitting element ED and the electrodes RME1 and RME2, respectively. During the process of removing the second insulating layer PAS2' to form the second insulating layer PAS2, the both ends of the light-emitting element ED where the semiconductor layer is disposed may be exposed. Concurrently (or simultaneously), a part of the first insulating layer PAS1 is also removed so that the upper surfaces of the first electrode RME1 and the second electrode RME2 are exposed, and the contact electrodes CNE1 and CNE2 formed thereafter may respectively contact the electrodes RME1 and RME2 and the ends of the light-emitting elements ED. It is, however, to be understood that the present disclosure is not limited thereto. The first insulating layer PAS1 may be formed with openings therein exposing the upper surfaces of the electrodes RME1 and RME2, and a process of removing a part of the second insulating material layer PAS2' may be carried out before forming the contact electrodes CNE1 and CNE2.

By performing the above-described processes, the display device 10 according to an embodiment of the present disclosure can be fabricated. The display device 10 may apply an alignment signal for aligning the light-emitting elements ED through the first voltage line VL1 and the second voltage line VL2, and an electric field may be generated between the electrodes RME1 and RME2 disposed separately in each of the sub-pixels PXn. Because the alignment signal applied to align the light-emitting elements ED is applied through the third conductive layer having a low line resistance under the display element layer, issues of heat generated by applied signals and voltage drop in an alignment signal may be prevented or mitigated.

Although each of the sub-pixels PXn of the display device 10 includes only one first electrode RME1 and one second electrode RME2 in the embodiment shown in the drawings, the present disclosure is not limited thereto. In the display device 10 according to an embodiment of the present disclosure, more electrodes may be disposed in each of the sub-pixels PXn. Some of the electrodes may be connected with one another such that the same alignment signal is applied thereto during the process of fabricating the light-emitting elements ED, while a signal may be applied to only some of the electrodes during the driving the display device 10. Hereinafter, display devices according to other embodiments of the present disclosure will be described below with reference to other drawings.

Figure 13:
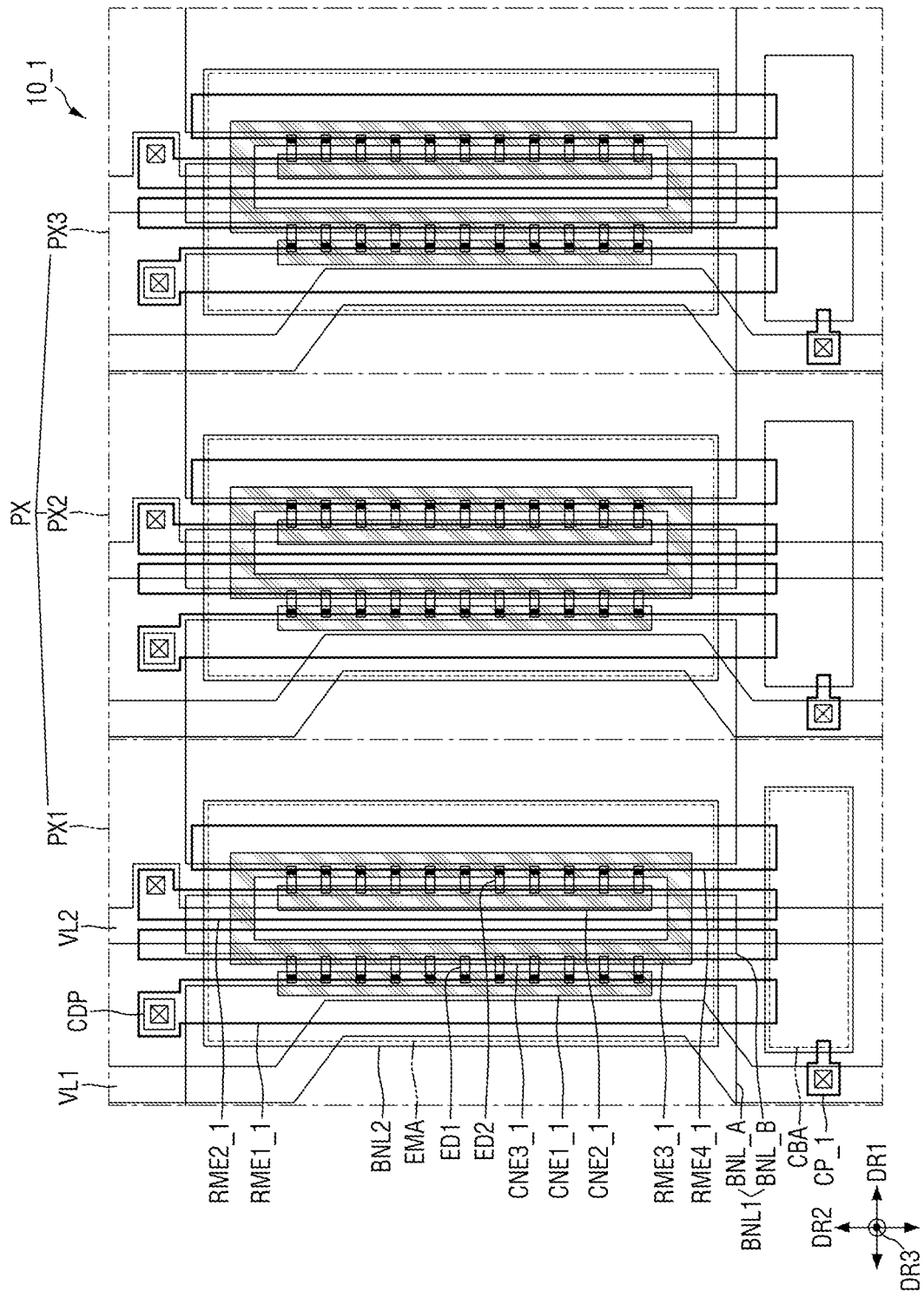
FIG. 13 is a plan view showing a pixel of a display device according to another embodiment of the present disclosure.
Figure 14:
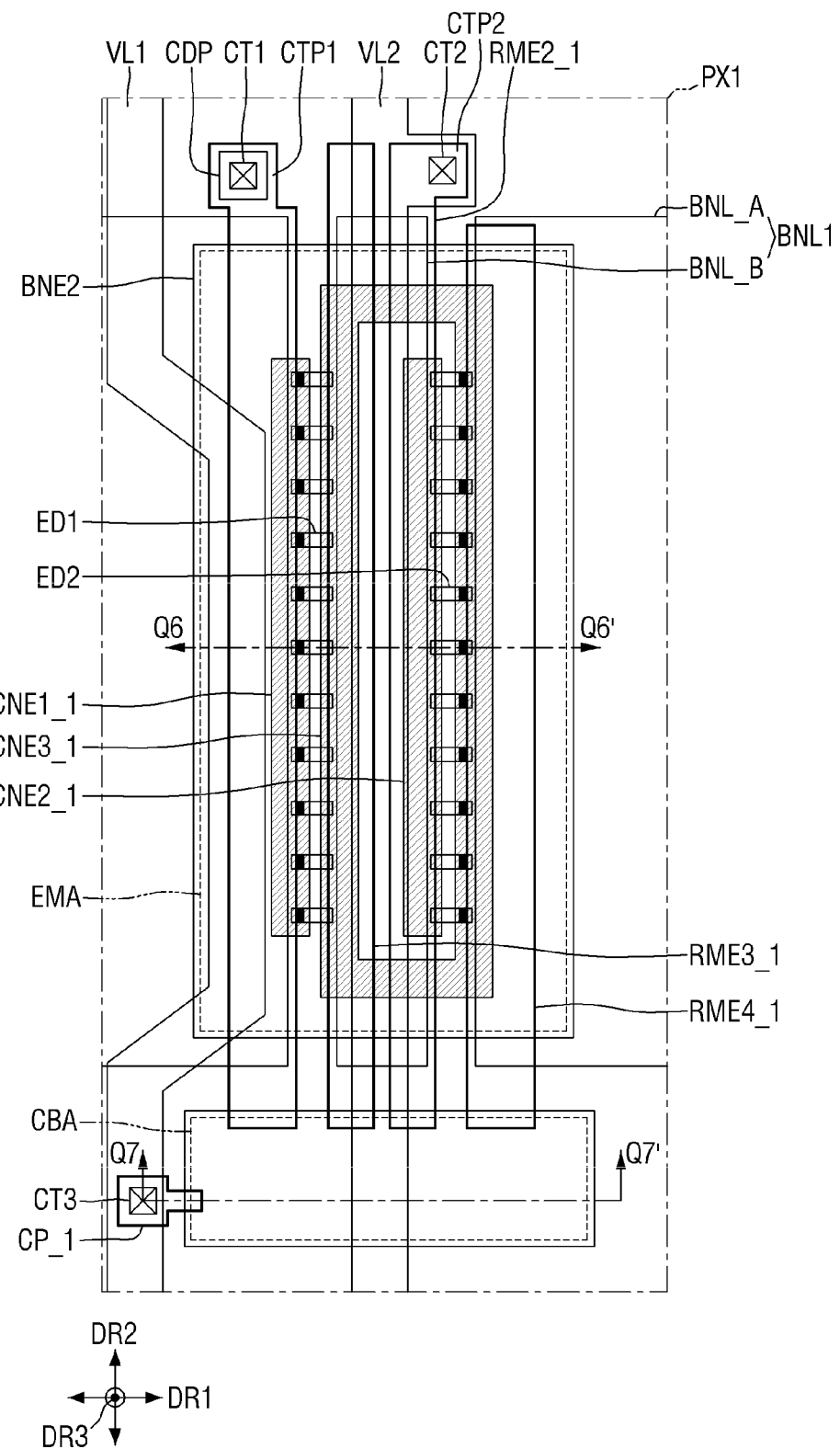
FIG. 14 is a plan view showing a first sub-pixel PX1 of the display device shown in FIG. 13.
Figure 15:
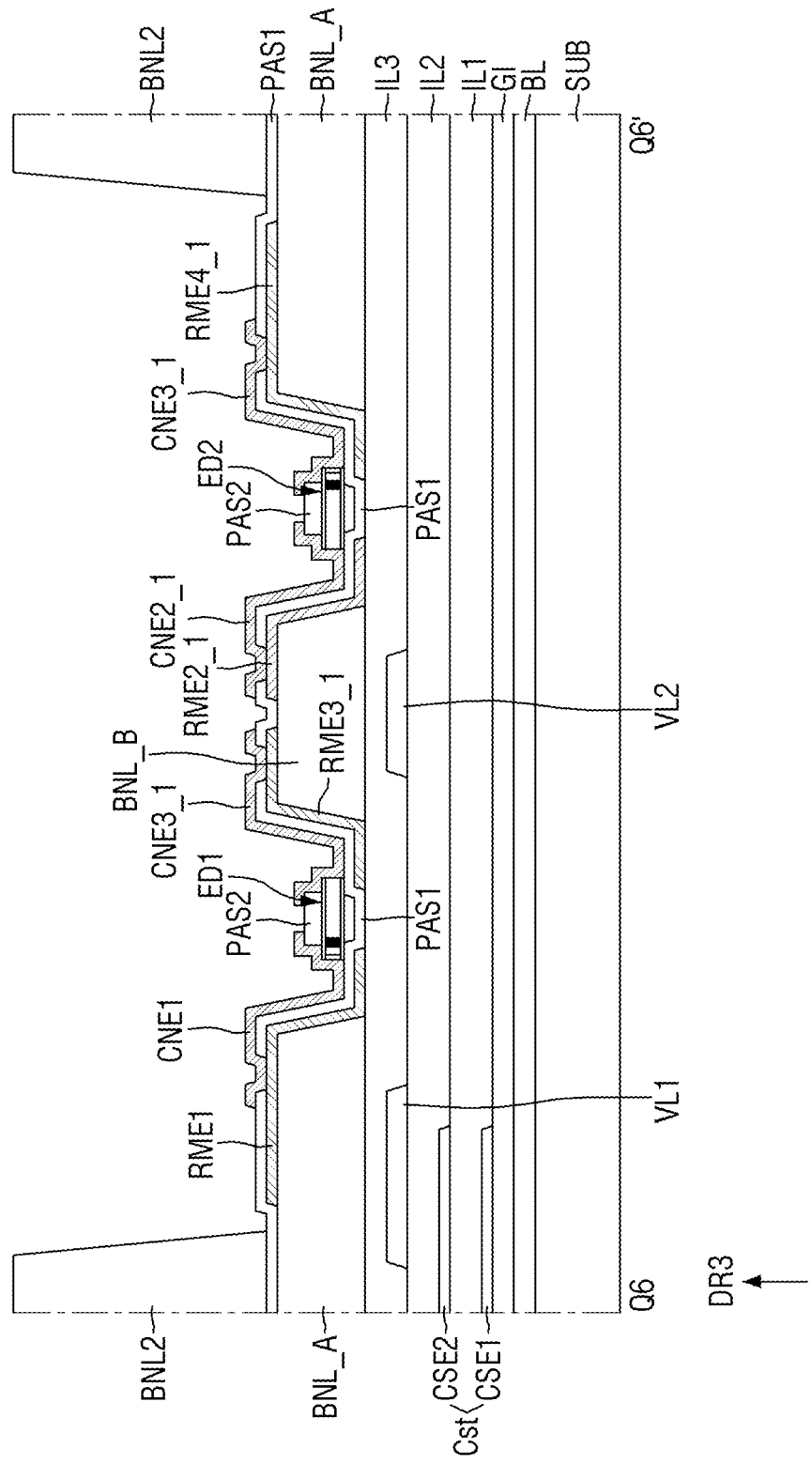
FIG. 15 is a cross-sectional view taken along the line Q6-Q6' in FIG. 14.

FIG. 13 is a plan view showing a pixel of a display device according to another embodiment of the present disclosure, FIG. 14 is a plan view showing a first sub-pixel of the display device shown in FIG. 13, and FIG. 15 is a cross-sectional view taken along the line Q6-Q6' in FIG. 14. FIG. 14 shows a first sub-pixel PX1 of a display device 10_1 shown in FIG. 13. FIG. 15 is a view showing a cross section from one end to the other end of a first light-emitting element ED1 and a second light-emitting element ED2 disposed in a first sub-pixel PX1 shown in FIG. 14.

Referring to FIGS. 13 to 15, the display device 10_1 according to an embodiment may include a greater number of electrodes RME1_1, RME2_1, RME3_1, and RME4_1, light-emitting elements ED1 and ED2, and contact electrodes CNE1_1, CNE2_1, and CNE3_1 in each of the sub-pixels PXn. The display device 10_1 may further include a third electrode RME3_1 and a fourth electrode RME4_1 in addition to a first electrode RME1_1 and a second electrode RME2_1 disposed in each of the sub-pixels PXn and may include a first light-emitting element ED1 disposed between the first electrode RME1_1 and the third electrode RME3_1 and a second light-emitting element ED2 disposed between the second electrode RME2_1 and the fourth electrode RME4_1. Each of the sub-pixels PXn may include a greater number of light-emitting elements ED1 and ED2 so that luminance per unit area can be improved. In addition, different from the first electrode RME1_1 and the second electrode RME2_1, the third electrode RME3_1 and the fourth electrode RME4_1 may not be connected directly to the third conductive layer, but the first light-emitting element ED1 and the second light-emitting element ED2 may be connected to each other in series through a third contact electrode CNE3_1. Hereinafter, the description will focus on the differences between the embodiments shown in FIGS. 2 to 5 and FIGS. 13 to 15.

Each of the first voltage line VL1 and the second voltage line VL2 of the third conductive layer may extend in the second direction DR2. The first voltage line VL1 may include a portion extending in the second direction DR2 and a portion bent therefrom. A portion of the first voltage line VL1 that extends in the second direction DR2 at the border of the sub-pixel PXn and bent may be located within the emission area EMA. The bent portion may be disposed to overlap the first electrode RME1_1 in the thickness direction. The second voltage line VL2 may extend in the second direction DR2 from the center of each of the sub-pixels PXn when viewed from the top and may overlap the second electrode RME2_1 and the third electrode RME3_1 in the thickness direction.

The second voltage line VL2 may overlap a second sub-bank BNL_B in the thickness direction and may extend in the second direction DR2. In addition, the second voltage line VL2 may include a line contact portion protruding in one direction of the first direction DR1 from the extended portion of the second bank BNL2 in the first direction DR1. The second electrode RME2_1 is formed such that the second electrode contact portion CTP2 overlaps the line contact portion in the thickness direction, and they may be connected to each other through the second contact opening (e.g., the second contact hole) CT2.

The first bank BNL1 may include first sub-banks BNL_A disposed across adjacent sub-pixels PXn, and a second sub-bank BNL_B disposed between the first sub-banks BNL_A. A plurality of second sub-banks BNL_B extend in the second direction DR2 and are spaced apart from one another in the first direction DR1 are disposed in the center of the emission area EMA. The first sub-banks BNL_A may be disposed on both sides of the second sub-banks BNL_B in the first direction DR1, respectively. The first banks BNL1 according to this embodiment are substantially identical to the first banks BNL1 shown in FIG. 3 except that the former further includes first sub-banks BNL_A arranged in the substantially the same pattern and second sub-banks BNL_B disposed between the first sub-banks BNL_A spaced apart from each other in the first direction DR1.

The first electrode RME1_1 may extend in the second direction DR2 and may traverse the emission area EMA to reach the cut area CBA. A part of the first electrode RME1 that overlaps the second bank BNL2 located on the upper side of the emission area EMA is formed as a first electrode contact portion CTP1, and the first electrode contact portion CTP1 may contact the first conductive pattern CDP through the first contact opening (e.g., the first contact hole) CT1. The first electrode RME1_1 may extend in the second direction DR2 from the first electrode contact portion CTP1 and may be partially disposed in the cut area CBA but may not extend beyond the cut area CBA. Also, the first electrode RME1_1 may be disposed on the first sub-bank BNL_A disposed on the left side of the emission area EMA from among the first sub-banks BNL_A.

Similar to the first electrode RME1_1, the second electrode RME2_1 may also extend in the second direction DR2 and may traverse the emission area EMA to reach the cut area CBA. A part of the second electrode RME2_1 that overlaps the second bank BNL2 located on the upper side of the emission area EMA is formed as a second electrode contact portion CTP2, and the second electrode contact portion CTP2 may contact the second voltage line VL2 through the second contact opening (e.g., the second contact hole) CT2. The second electrode RME2_1 may extend in the second direction DR2 from the second electrode contact portion CTP2 and may be partially disposed in the cut area CBA but may not extend beyond the cut area CBA. In addition, the second electrode RME2_1 may be disposed on the right side of the second sub-bank BNL_B in the first direction DR1.

The third electrode RME3_1 may be disposed between the first electrode RME1_1 and the second electrode RME2_1, and the fourth electrode RME4_1 may be disposed on the opposite side of the second electrode RME2_1 relative to the third electrode RME3_1. The third electrode RME3_1 and the fourth electrode RME4_1 may extend in the second direction DR2 and may be spaced apart from the second electrode RME2_1 interposed therebetween in the first direction DR1. Each of the third electrode RME3_1 and the fourth electrode RME4_1 may partially overlap the second bank BNL2 located on the upper side of the emission area EMA and may extend therefrom to the cut area CBA. Although the length of the third electrode RME3_1 in the second direction DR2 is larger than that of the fourth electrode RME4_1 in the drawings, the present disclosure is not limited thereto. The third electrode RME3_1 is disposed on the same second sub-bank BNL_B as the second electrode RME2_1 but is disposed on the left side, which is the other side of the second sub-bank BNL_B, in the first direction DR1. The fourth electrode RME4_1 is on another first sub-bank BNL_A different from the first sub-bank BNL_A on which the first electrode RME1_1 is disposed, and may be disposed on the first sub-bank BNL_A disposed on the right side of the center of the emission area EMA.

Different from the first electrode RME1_1 and the second electrode RME2_1, the third electrode RME3_1 and the fourth electrode RME4_1 may not electrode contact portions and may not be connected to the third conductive layer thereunder. While the third electrode RME3_1 and the fourth electrode RME4_1 may be electrically connected to the second voltage line VL2 and the first voltage line VL1 during the process of fabricating the display device 10_1 so that alignment signals are transmitted thereto, they may be separated from the electrode separation portion ROP and may not be connected directly to the circuit layer thereunder. As will be described later, the third electrode RME3_1 and the fourth electrode RME4_1 may contact and be connected to the third contact electrode CNE3_1 and may not remain floating.

The first light-emitting element ED1 is disposed on the first electrode RME1_1 and the third electrode RME3_1, and the second light-emitting element ED2 is disposed on the second electrode RME2_1 and the fourth electrode RME4_1. The light-emitting elements ED1 and ED2 may be oriented such that their first ends, where the first semiconductor layer 31 is disposed, face each other. Because the sub-pixels PXn of the display device 10_1 include a greater number of electrodes, the first end of the first light-emitting element ED1 may face in an opposite direction from the direction at which the first end of the second light-emitting element ED2 faces. For example, the first end of the first light-emitting element ED1 may be disposed on the third electrode RME3_1, and the opposite second end thereof may be disposed on the first electrode RME1_1, and thus, the first light-emitting elements ED1 may be arranged so that their first ends face one side in the first direction DR1. On the other hand, the first end of the second light-emitting element ED2 may be disposed on the second electrode RME2_1, and the opposite second end thereof may be disposed on the fourth electrode RME4_1, and thus, the second light-emitting elements ED1 may be arranged so that their first ends face the other side in the first direction DR1. The first light-emitting element ED1 and the second light-emitting element ED2 having the orientations opposite to each other may be connected to each other in series through a third contact electrode CNE3_1, which will be described in more detail below.

The first contact electrode CNE1_1 may be disposed on the first electrode RME1_1 and may contact the second end of the first light-emitting element ED1. The second contact electrode CNE2_1 may be disposed on the second electrode RME2_1 and may contact the first end of the second light-emitting element ED2. The first contact electrode CNE1_1 and the second contact electrode CNE2_1 may contact the first electrode RME1_1 and the second electrode RME2_1, respectively, and they may transmit supply voltages for driving the light-emitting elements ED1 and ED2 through the first transistor T1 and the second voltage line VL2.

The third contact electrode CNE3_1 may be disposed on the third electrode RME3_1 and the fourth electrode RME4_1. The third contact electrode CNE3_1 may include an electrode extension extending in the second direction DR2 and disposed on the third electrode RME3_1 or the fourth electrode RME4_1, and a plurality of electrode connectors connecting between them. The electrode extensions of the third contact electrode CNE3_1 may be disposed on the third electrode RME3_1 or the fourth electrode RME4_1 and may extend in the second direction DR2. The electrode connectors of the third contact electrode CNE3_1 may extend in the first direction DR1 to connect between the electrode extensions. The third contact electrode CNE3_1 may be disposed in a shape surrounding (e.g., extending around) the second contact electrode CNE2_1 when viewed from the top.

The electrode extensions of the third contact electrode CNE3_1 may contact the third electrode RME3_1 or the fourth electrode RME4_1 and one end of the light-emitting elements ED1 and ED2. For example, the electrode extension of the third contact electrode CNE3_1 disposed on the third electrode RME3_1 may contact the third electrode RME3_1 and the first end of the first light-emitting element ED1, and the electrode extension of the third contact electrode CNE3_1 disposed on the fourth electrode RME4_1 may contact the fourth electrode RME4_1 and the second end of the second light-emitting element ED2.

Supply voltages may be applied to the first light-emitting element ED1 and the second light-emitting element ED2 through the first contact electrode CNE1_1 and the second contact electrode CNE2_1, respectively. The supply voltages may flow through the light-emitting elements ED1 and ED2 and may flow through the third contact electrode CNE3_1 between the first light-emitting element ED1 and the second light-emitting element ED2. The third contact electrode CNE3_1 may form a connection path between the first light-emitting element ED1 and the second light-emitting element ED2, and the first light-emitting element ED1 and the second light-emitting element ED2 may be connected to each other in series through the contact electrode CNE3_1. In addition, because the third contact electrode CNE3_1 contacts the third electrode RME3_1 and the fourth electrode RME4_1, the third electrode RME3_1 and the fourth electrode RME4_1 may not float but may be electrically connected to a circuit layer thereunder even though they are not directly connected to the circuit layer.

Incidentally, even when the display device 10_1 includes a greater number of electrodes in each of the sub-pixels PXn, the electrodes disposed in each of the sub-pixels PXn may be separated from the electrodes of other sub-pixels PXn similar to the above embodiment shown in FIGS. 2 and 3. During the process of fabricating the display device 10_1, some of the electrodes RME1_1, RME2_1, RME3_1, and RME4_1 disposed in each of the sub-pixels PXn may be connected to each other so that an alignment signal may be applied through the first voltage line VL1 and the second voltage line VL2. After the light-emitting elements ED are aligned, a process of removing the connection portion BP connecting the electrodes RME1_1, RME2_1, RME3_1, and RME4_1 may be carried out. Accordingly, the display device 10_1 according to an embodiment of the present disclosure may include an electrode pattern CP_1 formed separately from the electrodes RME1_1, RME2_1, RME3_1, and RME4_1 in the cut area CBA.

Figure 16:
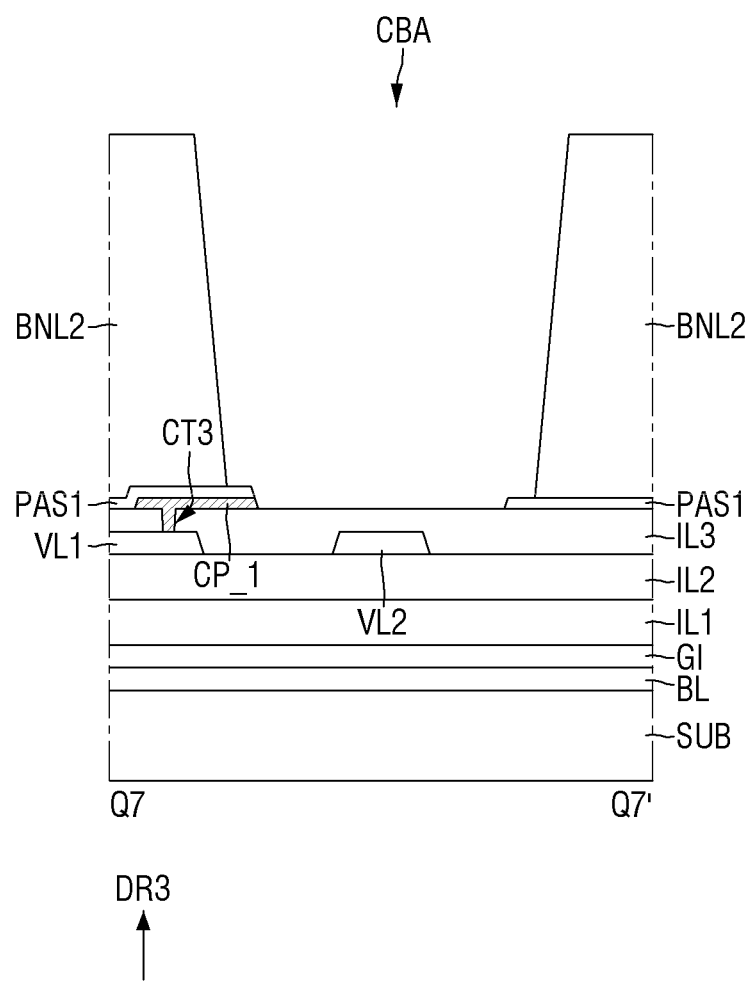
FIG. 16 is a cross-sectional view taken along the line Q7-Q7' in FIG. 14.

FIG. 16 is a cross-sectional view taken along the line Q7-Q7' of FIG. 14.

Referring to FIG. 16 in conjunction with FIG. 14, the electrode pattern CP_1 may be disposed in an area other than the emission area EMA so that it overlaps the second bank BNL2. The electrode pattern CP_1 may be disposed to overlap the second bank BNL2, which extends in the second direction DR2, on one side of the cut area CBA in the first direction DR1. The electrode pattern CP_1 may be disposed between the cut areas CBA of the sub-pixels PXn adjacent to each other in the first direction DR1, and a part of the electrode pattern CP_1 may include a trace separated from the cut area CBA of the respective sub-pixel PXn. For example, the electrode pattern CP_1 may be disposed outside the emission area EMA. The electrode pattern CP_1 may be disposed on the first voltage line VL1 thereunder (e.g., the electrode pattern CP_1 may be disposed over the first voltage line VL1) and may contact the first voltage line VL1 through a third contact opening (e.g., a third contact hole) CT3 penetrating through the third interlayer dielectric layer IL3. Although the electrode pattern CP_1 is disposed between the cut areas CBA of the sub-pixels PXn adjacent to each other in the drawings, the present disclosure is not limited thereto. The position of the electrode pattern CP_1 is not particularly limited as long as it is connected to the first voltage line VL1 and is separated from the first electrode RME1_1.

As described above, the process of separating the electrodes RME1_1, RME2_1, RME3_1, and RME4_1 from the electrode pattern CP_1 is carried out after the light-emitting elements ED are aligned and the second insulating layer PAS2 is formed. When the electrode pattern CP_1 is separated in the cut area CBA, the first insulating layer PAS1 may also be removed, and a part of the upper surface of the third interlayer dielectric layer IL3 of the cut area CBA may be exposed. In addition, because the first insulating layer PAS1 and the electrodes RME1_1, RME2_1, RME3_1, and RME4_1 may be removed together, their separated side surfaces may be aligned with one another.

Each of the sub-pixels of the display device 10_1 according to this embodiment may further include the third electrode RME3_1 and the fourth electrode RME4_1 in addition to the first electrode RME1_1 and the second electrode RME2_1. The light-emitting elements ED may include the first light-emitting element ED1 and the second light-emitting element ED2 with their first ends opposite to each other, and they may be connected in series to each other through the third contact electrode CNE3_1. During the process of fabricating the display device 10_1, some of the electrodes RME1_1, RME2_1, RME3_1, and RME4_1 are connected to each other and may receive the same alignment signal so that the first light-emitting element ED1 and the second light-emitting element ED2 are oriented in opposite directions.

Figure 17:
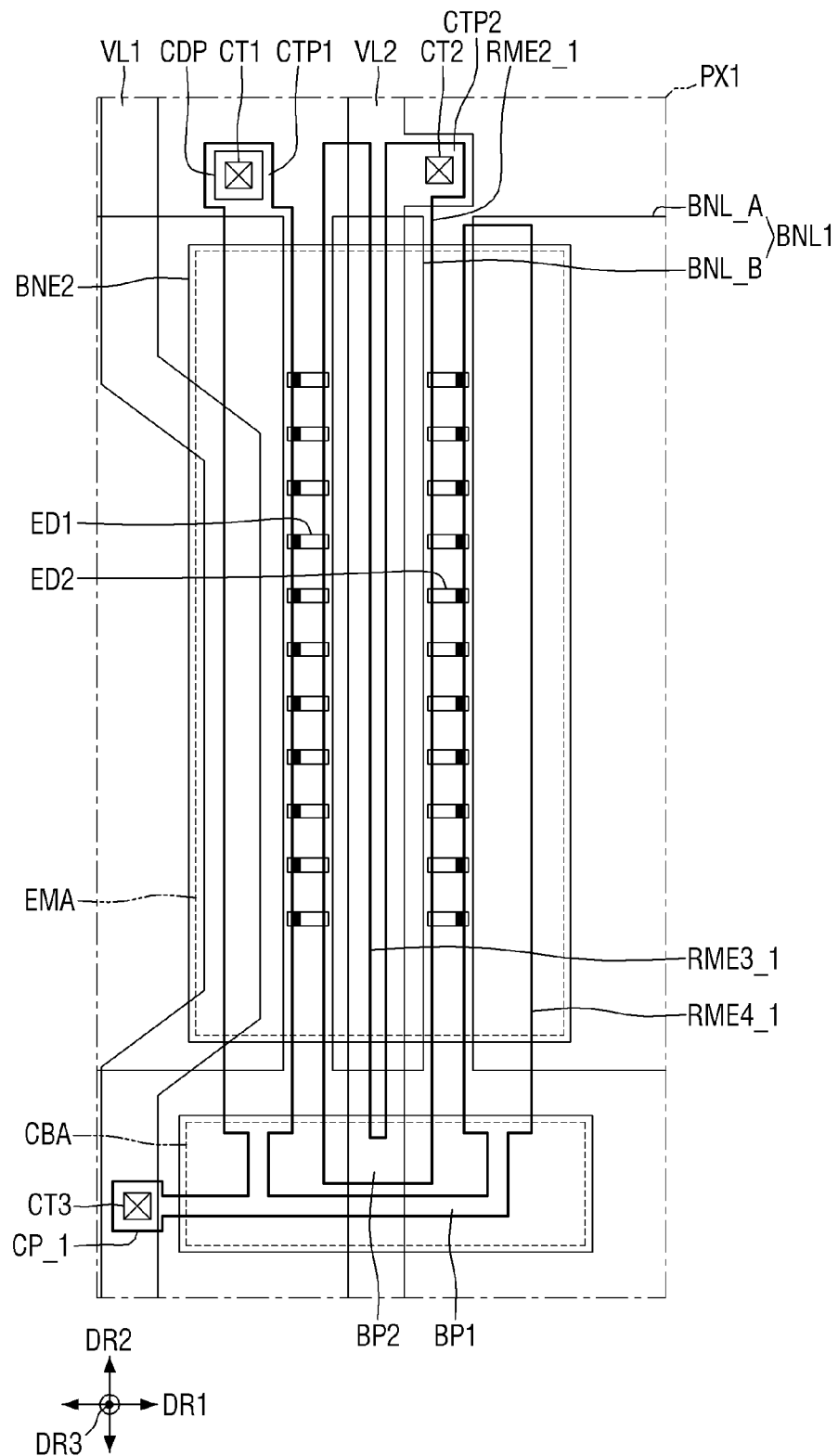
FIGS. 17 and 18 are plan views showing some of the processing steps of fabricating the display device shown in FIG. 14.
Figure 18:
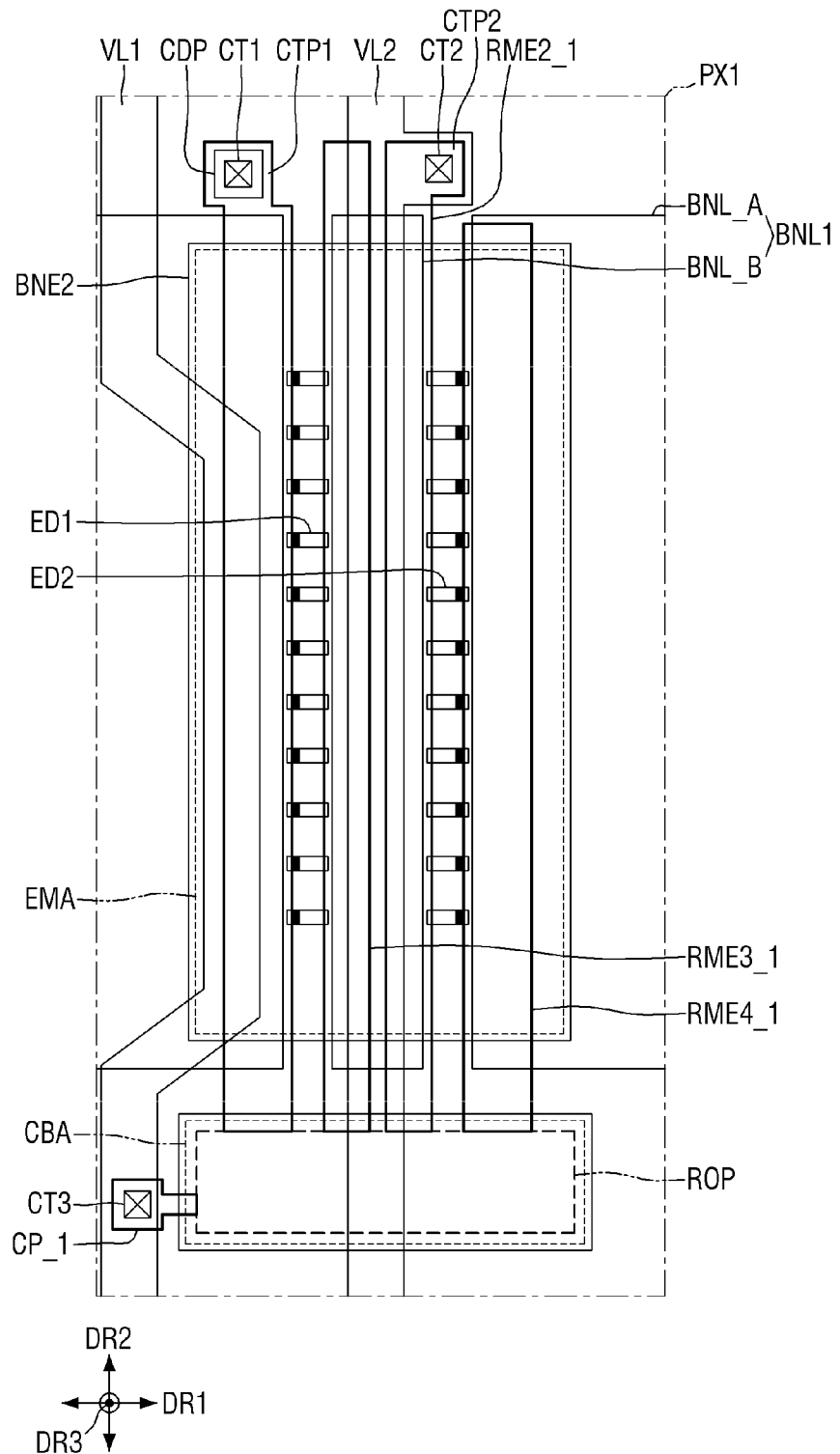

FIGS. 17 and 18 are plan views showing some of the processing steps of fabricating the display device shown in FIG. 14.

Referring to FIGS. 17 and 18, during the process of fabricating the display device 10_1, the first electrode RME1_1 and the fourth electrode RME4_1 may be connected to the electrode pattern CP_1 through the first connection portion BP1, and the second electrode RME2_1 and the third electrode RME3_1 may be connected to each other through the second connection portion BP2. The first connection portion BP1 and the second connection portion BP2 may be disposed in the cut area CBA to connect the electrodes RME1_1, RME2_1, RME3_1, and RME4_1 with one another. For example, the first connection portion BP1 may also be connected to the electrode pattern CP_1 connected directly to the first voltage line VL1.

The alignment signal applied to the first voltage line VL1 is transmitted to the first electrode RME1_1 and the fourth electrode RME4_1 through the electrode pattern CP_1 and the first connection portion BP1. The alignment signal applied to the second voltage line VL2 may be transmitted to the second electrode RME2_1 through the second electrode contact portion CTP2, which is transmitted to the third electrode RME3_1 through the second connection portion BP2. An electric field may be generated between the first electrode RME1_1 and the third electrode RME3_1 and between the second electrode RME2_1 and the fourth electrode RME4_1 according to an alignment signal applied to each of the first voltage line VL1 and the second voltage line VL2. The electric field may have a direction from an electrode to which an alignment signal is applied toward an electrode to which another alignment signal is applied. The light-emitting elements ED may be oriented according to the direction of the electric field. Because different alignment signals are applied to the first electrode RME1_1 and the fourth electrode RME4_1, and the second electrode RME2_1 and the third electrode RME3_1 during the process of fabricating the display device 10_1, the electric field may be directed toward the second sub-bank BNL_B disposed at the center of the emission area EMA, and the first ends of the light-emitting elements ED may also be disposed on the electrodes disposed on the second sub-bank BNL_B. Accordingly, the first ends of the first light-emitting element ED1 and the second light-emitting element ED2 may be disposed on the third electrode RME3_1 and the second electrode RME2_1, respectively, and they may be oriented in opposite directions.

Subsequently, the first connection portion BP1 and the second connection portion BP2 are removed at the electrode separation portion ROP of the cut area CBA to separate the electrodes RME1_1, RME2_1, RME3_1, and RME4_1 from one another. The first electrode RME1_1 and the second electrode RME2_1 are connected to the first transistor T1 and the second voltage line VL2 through electrode contact portions CTP1 and CTP2 formed in locations overlapping the second bank BNL2 on the upper side of the emission area EMA. On the other hand, the third electrode RME3_1 and the fourth electrode RME4_1 are separated from the connection portions BP1 and BP2, and thus, they may not be electrically connected to the circuit layer thereunder and may remain floating in each of the sub-pixels PXn. The third electrode RME3_1 and the fourth electrode RME4_1 may contact the third contact electrode CNE3_1 formed during a subsequent process and may not remain floating when the display device 10_1 is driven. The pattern CP_1 may be separated from the electrode separation portion ROP and may remain between the cut areas CBA of the neighboring sub-pixels PXn.

By removing the connection portions BP1 and BP2 at the electrode separation portion ROP to separate the electrodes RME1_1, RME2_1, RME3_1, and RME4_1 from one another, the sub-pixels PXn can be driven individually even though a signal is applied to the first voltage line VL1 and the second voltage line VL2.

Subsequently, a part of the first insulating layer PAS1 is removed to form an opening exposing a part of the upper surface of the electrodes, and the contact electrodes CNE1_1, CNE2_1, and CNE3_1 are formed, thereby producing the display device 10_1.

According to this embodiment, a greater number of electrodes RME1_1, RME2_1, RME3_1, and RME4_1 are included, so that a greater number of light-emitting elements ED1 and ED2 may be disposed in each of the sub-pixels PXn. Even though a greater number of electrodes RME1_1, RME2_1, RME3_1, and RME4_1 are included, only some of them may be electrically connected to the circuit layer thereunder, and the first light-emitting element ED1 and the second light-emitting element ED2 may be connected to each other in series through a current path formed by the third contact electrode CNE3_1.

The light-emitting elements ED may be connected to each other in series through the third contact electrode CNE3_1 so that the luminance of each of the sub-pixels PXn can be further improved. Furthermore, as the number of light-emitting elements ED connected to each other in series increases, even if some of the light-emitting elements ED are disconnected, the other light-emitting elements ED connected in series can emit light. As a result, it is possible to prevent or substantially prevent the sub-pixels PXn from failing to emit light.

In concluding the detailed description, those skilled in the art will appreciate that many variations and modifications can be made to the embodiments described herein without substantially departing from the aspects and features of the present disclosure. Therefore, the disclosed embodiments of the present disclosure are used in a generic and descriptive sense and not for purposes of limitation. The present disclosure is to be defined by the appended claims and their equivalents.

What is claimed is:

1. A display device comprising:
a substrate;
a conductive layer on the substrate and comprising a first voltage line and a second voltage line extending in a first direction;
a first electrode and a second electrode on the conductive layer, extending in the first direction, and spaced apart from each other;
a plurality of light-emitting elements on the first electrode and the second electrode; and
an electrode pattern on the conductive layer and separated from the first electrode,
wherein the electrode pattern overlaps the first voltage line in a thickness direction and directly contacts the first voltage line, and
wherein a lower surface of the electrode pattern and a lower surface of the first electrode are directly disposed on the same layer.

2. The display device of claim 1, wherein the electrode pattern is spaced apart from the first electrode in the first direction.

3. The display device of claim 1, further comprising an interlayer dielectric layer on the conductive layer,
wherein the electrode pattern contacts the first voltage line through a contact opening penetrating through the interlayer dielectric layer.

4. The display device of claim 3, further comprising a plurality of first banks between the interlayer dielectric layer and the first electrode and between the interlayer dielectric layer and the second electrode,
wherein the electrode pattern does not overlap the first banks and is directly on the interlayer dielectric layer.

5. The display device of claim 3, further comprising a second bank on the interlayer dielectric layer and extending around a periphery of an emission area at where the light-emitting elements are arranged and a cut area at one side of the emission area in the first direction,
wherein the electrode pattern overlaps the second bank in the thickness direction.

6. The display device of claim 5, wherein the first electrode and the electrode pattern are spaced apart from each other with the cut area therebetween, and
wherein the second electrode extends across the cut area from the emission area.

7. The display device of claim 5, wherein the conductive layer further comprises a first conductive pattern electrically connected to the first voltage line through a first transistor between the substrate and the conductive layer,
wherein the first electrode directly contacts the first conductive pattern through a first contact opening penetrating through the interlayer dielectric layer, and
wherein the second electrode directly contacts the second voltage line through a second contact opening penetrating through the interlayer dielectric layer.

8. The display device of claim 7, wherein the first electrode contacts the first conductive pattern at a first electrode contact portion arranged at one side of the emission area in the first direction, and
wherein the second electrode contacts the second voltage line at a second electrode contact portion at an opposite side of the cut area in a second direction.

9. The display device of claim 1, further comprising a first insulating layer partially covering the first electrode and the second electrode,
wherein the light-emitting elements are directly on the first insulating layer.

10. The display device of claim 9, further comprising:
a first contact electrode on the first insulating layer and contacting the first electrode and the light-emitting elements, and
a second contact electrode on the first insulating layer and contacting the second electrode and the light-emitting elements.

11. The display device of claim 9, further comprising a second insulating layer on the light-emitting elements.

12. A display device comprising:
a substrate having an emission area and a cut area at one side of the emission area;
a first electrode and a second electrode on the substrate, extending in a first direction, and spaced apart from each other in a second direction;
a third electrode between the first electrode and the second electrode;
a fourth electrode spaced apart from the third electrode in the second direction with the second electrode therebetween;
a plurality of light-emitting elements on at least two of the first to fourth electrodes that are spaced apart from one another in the second direction;
an electrode pattern separated from the first electrode and outside the emission area;
a first contact electrode on the first electrode and contacting the light-emitting elements, and a second contact electrode on the second electrode and contacting the light-emitting elements; and
a third contact electrode on the third electrode and the fourth electrode and contacting the light-emitting elements.

13. The display device of claim 12, further comprising a conductive layer on the substrate and comprising a first voltage line and a second voltage line extending in the first direction,
wherein the electrode pattern is directly connected to the first voltage line.

14. The display device of claim 13, wherein the electrode pattern and the first electrode are partially in the cut area and spaced apart from each other.

15. The display device of claim 13, wherein the electrode pattern is at one side of the cut area in the second direction and overlaps the first voltage line in a thickness direction.

16. The display device of claim 13, further comprising a first transistor between the substrate and the conductive layer and electrically connected to the first voltage line,
wherein the first electrode is electrically connected to the first transistor, and the second electrode is directly connected to the second voltage line.

17. The display device of claim 13, further comprising:
a plurality of first banks between the substrate and the first to fourth electrodes, respectively; and
a second bank extending around a periphery of the emission area and the cut area,
wherein each of the first electrode and the second electrode comprises an electrode contact portion overlapping the second bank.

18. The display device of claim 12, wherein the light-emitting elements comprise a first light-emitting element having a first end on the first electrode and a second end on the third electrode, and a second light-emitting element having a first end on the fourth electrode and a second end on the second electrode.

19. The display device of claim 18, wherein the first contact electrode contacts the first end of the first light-emitting element and the first electrode, and
the second contact electrode contacts the second end of the second light-emitting element and the second electrode.

20. The display device of claim 19, wherein the third contact electrode extends around a periphery of the second contact electrode and contacts the third electrode, the fourth electrode, the second end of the first light-emitting element, and the first end of the second light-emitting element.

* * * * *